(12) United States Patent
Matsukura

(10) Patent No.: US 7,745,269 B2
(45) Date of Patent: Jun. 29, 2010

(54) SEMICONDUCTOR DEVICE AND MANUFACTURE METHOD THEREOF

(75) Inventor: Hideki Matsukura, Atsugi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/500,343

(22) Filed: Jul. 9, 2009

(65) Prior Publication Data

US 2009/0269900 A1 Oct. 29, 2009

Related U.S. Application Data

(62) Division of application No. 12/031,881, filed on Feb. 15, 2008, now Pat. No. 7,569,886.

(30) Foreign Application Priority Data

Mar. 8, 2007 (JP) ............................. 2007-058203

(51) Int. Cl.
*H01L 21/00* (2006.01)

(52) U.S. Cl. ............... 438/149; 438/164; 257/E21.094; 257/E21.104

(58) Field of Classification Search ................. 438/149, 438/151, 163, 164, 517; 257/E21.094, E21.104, 257/E21.372, E21.411, E21.416
See application file for complete search history.

(56) References Cited

U.S. PATENT DOCUMENTS

| | | | |
|---|---|---|---|
| 5,121,186 A | 6/1992 | Wong et al. | |
| 5,338,702 A | 8/1994 | Kobeda et al. | |
| 5,341,028 A | 8/1994 | Yamaguchi et al. | |
| 5,583,366 A | 12/1996 | Nakazawa | |
| 5,656,825 A | 8/1997 | Kusumoto et al. | |
| 5,940,690 A | 8/1999 | Kusumoto et al. | |
| 6,337,232 B1 | 1/2002 | Kusumoto et al. | |
| 6,455,875 B2 | 9/2002 | Takemura et al. | |
| 6,541,795 B2 | 4/2003 | Kusumoto et al. | |
| 6,882,018 B2 | 4/2005 | Ohtani et al. | |
| 6,953,714 B2 * | 10/2005 | Kimura et al. | ............... 438/149 |
| 7,223,666 B2 | 5/2007 | Ohtani et al. | |
| 7,238,557 B2 | 7/2007 | Hayakawa | |
| 7,262,469 B2 | 8/2007 | Makita | |
| 2007/0210451 A1 | 9/2007 | Ohtani et al. | |
| 2007/0228374 A1 | 10/2007 | Hayakawa | |

FOREIGN PATENT DOCUMENTS

| | | |
|---|---|---|
| JP | 02-076264 | 3/1990 |
| JP | 05-013762 | 1/1993 |
| JP | 07-335906 | 12/1995 |
| JP | 2003-218362 | 7/2003 |

\* cited by examiner

*Primary Examiner*—Quoc D Hoang
(74) *Attorney, Agent, or Firm*—Nixon Peabody LLP; Jeffrey L. Costellia

(57) ABSTRACT

An object is to provide an element structure of a semiconductor device for increasing an etching margin for various etching steps and a method for manufacturing the semiconductor device having the element structure. An island-shaped semiconductor layer is provided over an insulator having openings. The island-shaped semiconductor layer includes embedded semiconductor layers and a thin film semiconductor layer. The embedded semiconductor layers have a larger thickness than that of the thin film semiconductor layer.

12 Claims, 15 Drawing Sheets

2180

2180

2180

2180

2180

2180

2180

2180

SEMICONDUCTOR DEVICE AND MANUFACTURE METHOD THEREOF

BACKGROUND OF THE INVENTION

1. Field of the Invention

The present invention relates to a semiconductor device and a manufacture method thereof.

2. Description of the Related Art

A thin film transistor (TFT) is formed using a semiconductor film.

In order to achieve high performance in a semiconductor device in which thin film transistors are used, various technologies have been examined.

For example, the following technology can be given: by thinning a channel formation region of a semiconductor layer, improvement in field-effect mobility and a field-effect sub-threshold property, and reduction in leak current can be achieved.

A channel formation region, a source region, and a drain region of a thin film transistor are formed using the identical semiconductor film in many cases.

In such a case, when the channel formation region of the thin film transistor is thinned, the source and drain regions are also thinned unintentionally.

If the source and drain regions are thinned, in etching when the source and drain regions are used as a base, a margin for overetching (an etching margin) is reduced drastically. Consequently, there arises a problem that contact holes reach bottom portions of the source and drain regions in forming the contact holes through an interlayer insulating film.

In this specification, the "margin" means a permissible range of process conditions in a production process. If a process is carried out under a process condition beyond the permissible range in the production process, a defect occurs in the semiconductor device. Therefore, as the margin increases, the incidence of defects decreases, so that restrictions on the process conditions decrease. On the other hand, as the margin decreases, the incidence of defects increases, so that restrictions on the process conditions increase.

When a contact hole reaches a bottom portion of a source region (or a bottom portion of a drain region), it is possible to contact a side of the contact hole with a contact electrode. However, an area of a side of the thinned source or drain region is close to zero. Therefore, contact resistance of the source region (or the drain region) and the contact electrode cannot sufficiently be lowered, so that a sufficient voltage cannot be applied to the source region (or the drain region). As a result, the thin film transistor cannot operate.

In order to solve the above problem, Reference 1 (Japanese Published Patent Application No. H5-13762) discloses a method in which a contact hole is formed by plural times of etching under different etching conditions.

SUMMARY OF THE INVENTION

The etching method disclosed in Reference 1 is excellent in that overetching is small.

However, in an actual manufacturing site, there are unavoidable problems however excellent an etching method is. This point is explained hereinafter.

An etching apparatus for a semiconductor device is required to have greatly high controllability because micromachining is performed in etching in a semiconductor device.

Therefore, with a small change in a condition of the etching apparatus (e.g., a change in an atmosphere in a chamber, a change in composition of an etchant, a problem in a power source, or an error of control software), the incidence of product defects increases.

For example, in a dry etching apparatus, when a plurality of substrates are sequentially etched, an atmosphere in a chamber changes every time a substrate is etched due to the remainder of a reacted product in the chamber or attachment of the reacted product to a chamber wall.

When the atmosphere in the chamber changes, etching reaction in the chamber varies even if set conditions of the etching apparatus are the same.

In a wet etching apparatus, on the other hand, a concentration composition ratio of an etchant changes every time of etching because an object to be etched reacts with the etchant and thus is etched.

When the concentration composition ratio of the etchant changes, etching reaction in the etching apparatus varies even if set conditions of the etching apparatus are the same.

When variations in etching reaction occur, there arises an etching defect (e.g., insufficient etching or overetching).

When etching is insufficient, an etching residue is left and the semiconductor device does not operate normally.

When an overetching amount is large, a film functioning as a base (an etching stopper film) disappears and the semiconductor device does not operate normally.

However, if etching is carried out such that overetching does not occur, it results in insufficient etching in many cases.

Accordingly, etching needs to be carried out so as to achieve overetching in a range in which the semiconductor device operates normally.

Therefore, a margin (etching margin) for overetching in manufacturing semiconductor devices needs to be increased in order to lower the incidence of product defects.

Further, such problems arise in other etching steps as well as in the etching step in forming contact holes.

In view of the above problems, an object of the present invention is to provide element structures of a semiconductor device for increasing an etching margin in various etching steps and methods for manufacturing a semiconductor device having the element structures.

A feature of a semiconductor device of the present invention is that: it includes an island-shaped semiconductor layer provided over an insulator having openings; the island-shaped semiconductor layer includes embedded semiconductor layers and a thin film semiconductor layer; and the thickness of the embedded semiconductor layers is larger than that of the thin film semiconductor layer.

The insulator having the openings may be an insulator having an aperture shape. Therefore, the insulator having the openings is not limited only to an insulator in which openings are formed intentionally.

In other words, the insulator having the openings includes an insulating substrate in which openings are formed intentionally, a single-layer or stacked-layer base insulating film in which openings are formed intentionally, an insulator having an aperture shape formed by attaching an insulator to an insulating surface, and the like. It is needless to say that the insulator having the openings is not limited to these examples given above.

Further, the embedded semiconductor layers are provided in regions overlapping with the openings, and have portions embedded in the openings (an embedded-shape). Accordingly, the embedded semiconductor layers are not limited to semiconductor layers embedded in the insulator having the openings.

On the other hand, the thin film semiconductor layer is a semiconductor layer provided in a region which does not overlap with the openings.

Further, an interlayer insulating film is formed over the island-shaped semiconductor layer. Another feature of the semiconductor device of the present invention is that contact holes through the interlayer insulating film are formed overlapping with the embedded semiconductor layers.

Wirings formed over the interlayer insulating film are electrically connected to the embedded semiconductors through the contact holes.

It is preferable that the contact holes be formed so as to reach insides of the embedded semiconductor layers.

Further, it is also preferable that the contact holes be formed so as to pass through the embedded semiconductor layers.

Another feature of the semiconductor device of the present invention is that: the island-shaped semiconductor layer includes a channel formation region formed between a source region and a drain region, the source region and the drain region are formed in the embedded semiconductor layers, and the channel formation region is formed in the thin film semiconductor layer.

Another feature is that a gate electrode is formed over the channel formation region with a gate insulating film interposed therebetween.

The source region and the drain region are high-concentration impurity regions, to which an impurity element imparting a conductivity type is added.

Another feature is that sidewalls whose first end portions are in contact with sides of the gate electrode are formed.

Another feature is that low-concentration impurity regions, to which an impurity element imparting a conductivity type is added, are formed in the island-shaped semiconductor layer, and the sidewalls and the low-concentration impurity regions overlap with each other.

Another feature is that second end portions of the sidewalls are formed overlapping with the embedded semiconductor layers. In this case, the low-concentration impurity regions are formed in both the embedded semiconductor layers and the thin film semiconductor layer.

The gate insulating film, the gate electrode, and the sidewalls are formed under the interlayer insulating film.

The semiconductor device according to the present invention includes an insulator having openings, an island-shape semiconductor layer formed over the insulator, a gate insulating film formed over the island-shaped semiconductor layer, a gate electrode formed over the gate insulating film, an interlayer insulating film formed over the gate electrode, and contact holes passing through the interlayer insulating film. The island-shaped semiconductor layer includes embedded semiconductor layers and a thin film semiconductor layer. The embedded semiconductor layers are embedded in the openings. The thin film semiconductor layer is provided so as not to overlap with the openings. The embedded semiconductor layers have a larger thickness than the thin film semiconductor layer. The contact holes are formed so as to overlap with the embedded semiconductor layers, whereby an etching margin for forming the contact holes is increased.

By providing sidewalls whose first end portions are in contact with sides of the gate electrode and whose second end portions overlap with the embedded semiconductor layers, an etching margin for forming the sidewalls can be increased.

By providing the gate electrode overlapping with the thin film semiconductor layer and the embedded semiconductor layers, an etching margin for forming the gate electrode can be increased.

A feature of the semiconductor device according to the present invention is that: it includes an island-shaped semiconductor layer that includes embedded semiconductor layers and a thin film semiconductor layer and is provided over an insulator having openings, a gate electrode formed over the thin film semiconductor layer with a gate insulating film interposed therebetween, an interlayer insulating film formed over the island-shaped semiconductor layer, the gate insulating film, and the gate electrode, and contact holes passing through the interlayer insulating film; the embedded semiconductor layers have a larger thickness than that of the thin film semiconductor layer; and the contact holes are formed overlapping with the embedded semiconductor layers.

Another feature of the semiconductor device according to the present invention is that: it includes an island-shaped semiconductor layer that includes embedded semiconductor layers and a thin film semiconductor layer and is provided over an insulator having openings, a gate electrode formed over the thin film semiconductor layer and the embedded semiconductor layers with a gate insulating film interposed therebetween, an interlayer insulating film formed over the island-shaped semiconductor layer, the gate insulating film, and the gate electrode, and contact holes passing through the interlayer insulating film; the embedded semiconductor layers have a larger thickness than that of the thin film semiconductor layer; and the contact holes are formed overlapping with the embedded semiconductor layers.

Another feature of the semiconductor device according to the present invention is that: it includes an island-shaped semiconductor layer that includes embedded semiconductor layers and a thin film semiconductor layer and is provided over an insulator having openings, a gate electrode formed over the thin film semiconductor layer with a gate insulating film interposed therebetween, sidewalls formed over the island-shaped semiconductor layer, an interlayer insulating film formed over the island-shaped semiconductor layer, the gate insulating film, the gate electrode, and the sidewalls, and contact holes passing through the interlayer insulating film; the embedded semiconductor layers have a larger thickness than that of the thin film semiconductor layer; the contact holes are formed overlapping with the embedded semiconductor layers; first end portions of the sidewalls are formed to be in contact with sides of the gate electrode; and second end portions of the sidewalls overlap with the embedded semiconductor layers.

Another feature is that the island-shaped semiconductor layer formed in a position overlapping with the sidewall is a low-concentration impurity region, and the low-concentration impurity region includes the embedded semiconductor layer and the thin film semiconductor layer.

Another feature of the semiconductor device according to the present invention is that a channel formation region is formed between a source region and a drain region in the island-shaped semiconductor layer, the channel formation region is the thin film semiconductor layer formed in a position overlapping with the gate electrode, and the source region and the drain region are formed in the embedded semiconductor layers.

Another feature of the semiconductor device according to the present invention is that the island-shaped semiconductor layer has a non-step shape.

Another feature of the semiconductor device according to the present invention is that the island-shaped semiconductor layer has a flat surface.

A method for manufacturing the semiconductor device according to the present invention includes a first method: after forming a first semiconductor film over an insulator provided with openings, embedded semiconductor layers are formed overlapping with the openings and at the same time a surface of the insulator is planarized by CMP; a second semiconductor film is formed over the embedded semiconductor layers and the insulator; the embedded semiconductor layers and the second semiconductor film are crystallized with a laser; the second semiconductor film is planarized by CMP; and the second semiconductor film is isolated into sections for each element, so that an island-shaped semiconductor layer including the embedded semiconductor layers and a thin film semiconductor layer that does not overlap with the opening is formed.

Further, a method for manufacturing the semiconductor device according to the present invention includes a second method: after forming a semiconductor film over an insulator provided with openings, the semiconductor film is crystallized with a laser; the semiconductor film is planarized by CMP; and the semiconductor film is isolated into sections for each element, so that an island-shaped semiconductor layer including embedded semiconductor layers that overlap with the openings and a thin film semiconductor layer that does not overlap with the openings is formed.

Further, a method for manufacturing the semiconductor device according to the present invention includes a third method: an embedded insulator having openings is provided at a first surface of a single crystalline semiconductor substrate; an insulating surface of a supporting substrate and the first surface of the single crystalline semiconductor substrate are attached to each other; a second surface of the single crystalline semiconductor substrate is polished; and part of the single crystalline semiconductor substrate is isolated into sections for each element, so that an island-shaped semiconductor layer including embedded semiconductor layers that overlap with regions where the openings are formed and a thin film semiconductor layer that does not overlap with the regions where the openings are formed is formed.

After forming the island-shaped semiconductor layer by any of the first to third methods, a gate electrode is formed over the island-shaped semiconductor layer with a gate insulating film interposed therebetween.

By making an island-shaped semiconductor layer have a thin film semiconductor layer and embedded semiconductor layers, an etching margin for various etching steps can be increased.

When sidewalls are provided, an etching margin for forming the sidewalls can be increased by forming the sidewalls so that second end portions thereof overlap with the embedded semiconductor layers.

DETAILED DESCRIPTION OF THE INVENTION

Embodiment Modes

Figure 1:
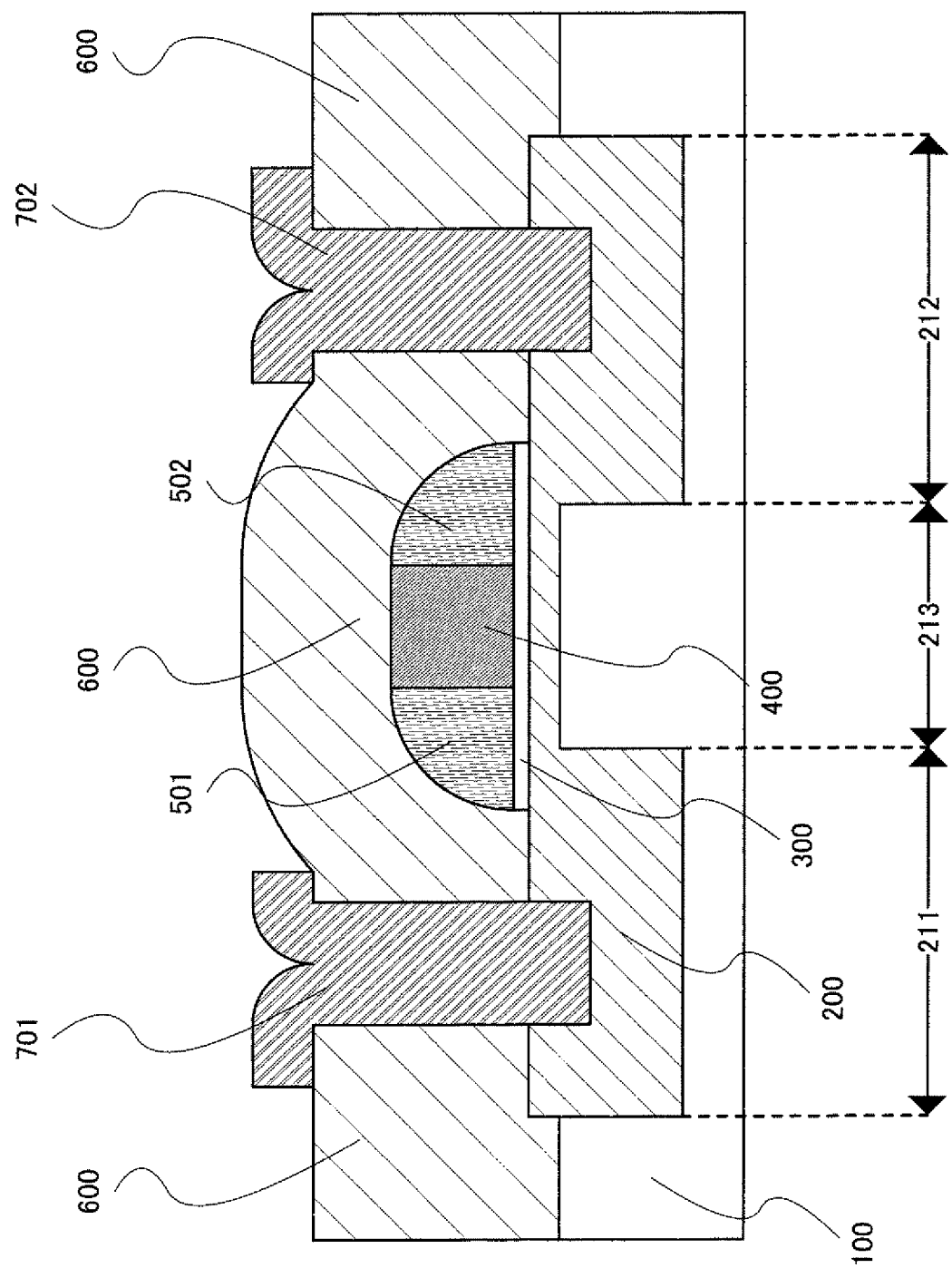
FIG. 1 is a cross-sectional view of a semiconductor device of the present invention.

Hereinafter, embodiment modes of the present invention are explained with reference to the drawings. Note that the present invention can be performed in many different modes and it is easily understood by those skilled in the art that the modes and details disclosed herein can be modified in various ways without departing from the spirit and the scope of the present invention. Therefore, the present invention should not be interpreted as being limited to the description of the embodiment modes.

The following Embodiment Modes 1 to 8 can be combined appropriately. Parts with the same reference numerals in the drawings can be formed using the same materials and by the same methods unless otherwise noted.

Embodiment Mode 1

This embodiment mode describes an element structure of a semiconductor device.

Figure 2:
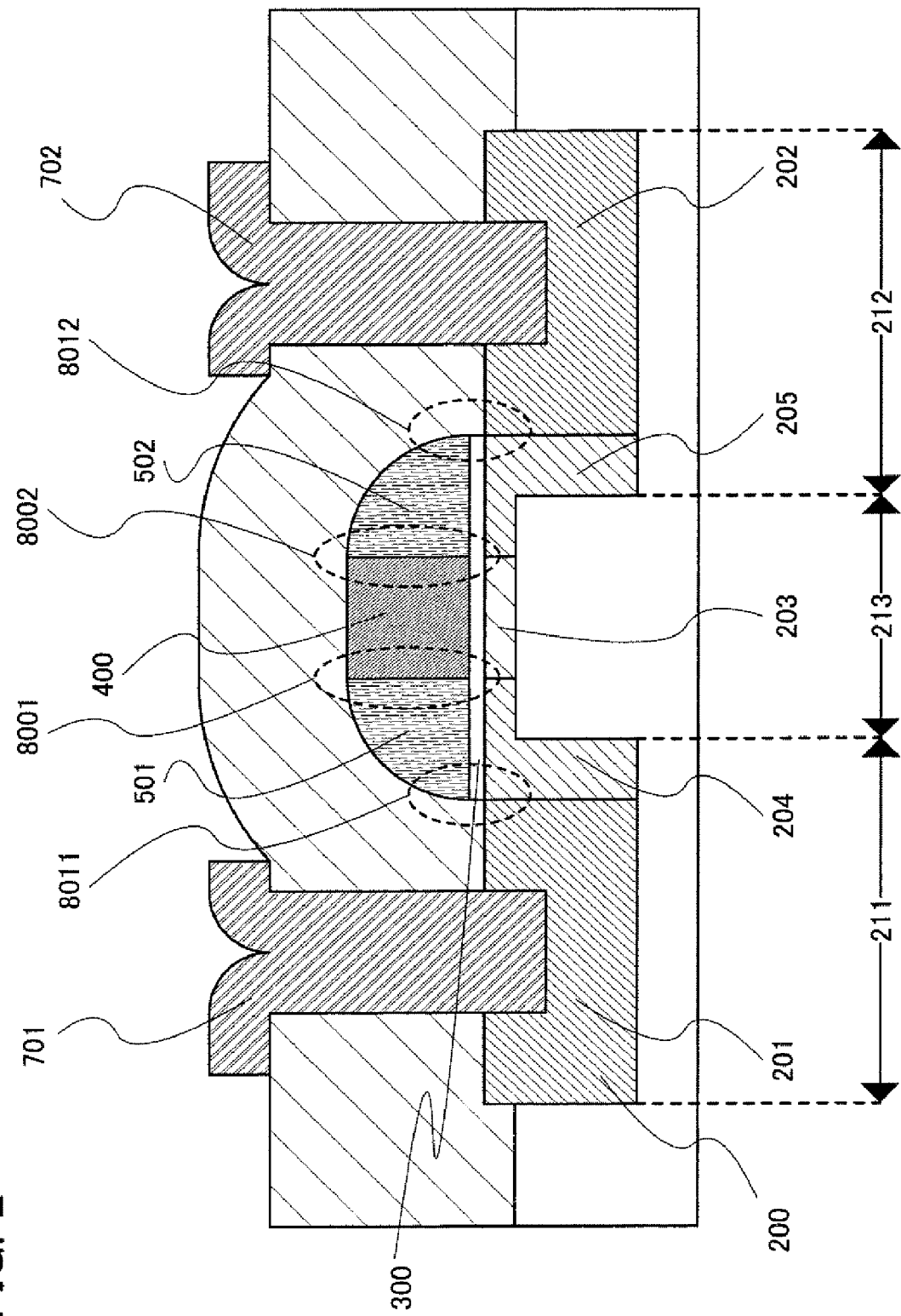
FIG. 2 is a cross-sectional view of a semiconductor device of the present invention.

FIGS. 1 and 2 are cross-sectional views of the semiconductor device of this embodiment mode.

The semiconductor device of this embodiment mode includes an insulator 100, an island-shaped semiconductor layer 200, a gate insulating film 300, a gate electrode 400, a sidewall 501, a sidewall 502, an interlayer insulating film 600, a wiring 701, and a wiring 702 (see FIG. 1).

The insulator 100 is provided with openings (has an aperture shape), and the island-shaped semiconductor layer 200 is partly embedded (has an embedded-shape).

The openings are formed in regions designated by reference numerals 211 and 212 in FIG. 1. The cross-section of the opening may have other shapes than a rectangle as shown in the drawing. For example, the cross-sectional shape of the opening may be a semicircle, a semiellipse, a trapezoid, or the like.

The island-shaped semiconductor layer 200 is formed over the insulator 100 having the openings.

In the island-shaped semiconductor layer 200, portions in the regions 211 and 212 are the embedded semiconductor layers.

That is to say, the embedded semiconductor layers are parts of the island-shaped semiconductor layer 200 and are formed in the regions overlapping with the openings.

Note that lower portions of the embedded semiconductor layers are embedded in the openings (the aperture shape) provided for the insulator 100 (in other words, the embedded semiconductor layers have the embedded-shape) as shown in FIG. 1.

In the island-shaped semiconductor layer, on the other hand, the semiconductor layer formed in a region 213 is the thin film semiconductor layer.

That is to say, the thin film semiconductor layer is part of the island-shaped semiconductor layer 200 and is formed in the region which does not overlap with the openings.

Therefore, the island-shaped semiconductor layer 200 has a structure in which the thin film semiconductor layer is provided between the two embedded semiconductor layers.

Note that the thickness of the embedded semiconductor layers is larger than that of the thin film semiconductor layer.

It is preferable that the thin film semiconductor layer have a thickness of 5 to 30 nm (more preferably, 5 to 10 nm).

The thickness of the embedded semiconductor layers can be set in a range obtained by adding the thickness of the thin film semiconductor layer to the depth of the opening. It is preferable that the opening have a depth of 20 to 300 nm. Therefore, it is preferable that the embedded semiconductor layers have a thickness of 25 to 330 nm.

As explained above, the thin film semiconductor layer to be a channel formation region has a small thickness of 30 nm or less. Further, the presence of the insulator under and in contact with the thin film semiconductor layer to be the channel formation region can entirely deplete a bottom portion of the channel formation region. The entire depletion of the channel formation region to the bottom portion allows forming a transistor with a preferable S value and a favorable threshold voltage. Without an insulator under and in contact with a semiconductor layer to be a channel formation region in a transistor (e.g., a transistor formed on a bulk silicon wafer), entire depletion to a bottom portion cannot be achieved.

The gate electrode 400 is formed over the island-shaped semiconductor layer 200 with the gate insulating film 300 interposed therebetween.

Further, the sidewalls 501 and 502 are formed in contact with side portions of the gate electrode 400.

Here, a positional relation of the structures is explained with reference to FIG. 2.

The island-shaped semiconductor layer 200 includes a source region 201, a drain region 202, a channel formation region 203, an LDD region 204, and an LDD region 205.

The source region and the drain region are high-concentration impurity regions, to which an impurity element imparting a conductivity type is added. The LDD (lightly doped drain) regions are low-concentration impurity regions to which an impurity element imparting the same conductivity type as in the source region and the drain region is added.

The channel formation region 203 and the LDD regions 204 and 205 are provided between the source region 201 and the drain region 202. The channel formation region 203 is provided between the LDD regions 204 and 205.

The channel formation region 203 is formed in the thin film semiconductor layer, and the source region 201 and the drain region 202 are formed in the embedded semiconductor layers; therefore, in the island-shaped semiconductor layer 200, the thin film semiconductor layer is provided between the two embedded semiconductor layers.

The LDD regions 204 and 205 are not necessarily provided. Further, only either the LDD region 204 or 205 may be provided.

If neither the LDD region 204 nor 205 is present, the channel formation region 203 is provided between the source region 201 and the drain region 202.

If only either the LDD region 204 or 205 is present the channel formation region 203 and the LDD region is provided between the source region 201 and the drain region 202.

If the channel length (the length of a channel formation region in a direction of carrier flow) is short, a defect called "a short channel effect" occurs. A structure in which an LDD region is provided is preferable for suppressing the short channel effect. Further, an LDD region has effects of improving a switching property due to lowering off-current, suppressing generation of hot carriers, and the like. For the above reasons, the structure with an LDD region is preferable.

The gate electrode 400 is formed over the channel formation region 203 with the gate insulating film 300 interposed therebetween.

The sidewall 501 is formed over the LDD region 204 with the gate insulating film 300 interposed therebetween. The sidewall 502 is formed over the LDD region 205 with the gate insulating film 300 interposed therebetween.

Although the gate insulating film is sandwiched between the LDD regions and the sidewalls in this embodiment mode, a structure in which a gate insulating film is not sandwiched between the LDD regions and the sidewalls may be employed.

Therefore, the sidewalls may be provided overlapping with the LDD regions. Placing the sidewalls overlapping with the LDD regions allows forming the LDD regions in a self-aligned manner, so that the number of masks to be used can be reduced and variations in LDD lengths among TFTs can be reduced.

A structure without sidewalls can also be employed because the LDD regions can be made using a mask. As described above, however, the structure with the sidewalls is preferable.

The sidewalls are formed by carrying out etching back in which the island-shaped semiconductor layer 200 is used as an etching stopper.

Accordingly, it is preferable that a part to function as the etching stopper in the island-shaped semiconductor layer 200 have a large thickness in order to have an etching margin for forming the sidewalls.

Therefore, it is preferable to form the sidewalls so as to have second end portions overlapping with the embedded semiconductor layers.

In FIG. 2, a first end portion of the sidewall 501 is designated by a dotted line 8001, and is in contact with the side portion of the gate electrode 400. A second end portion of the sidewall 501 is designated by a dotted line 8011, and overlaps with the embedded semiconductor layer formed in the region 211.

Further, in FIG. 2, a first end portion of the sidewall 502 is designated by a dotted line 8002, and is in contact with the side portion of the gate electrode 400. A second end portion of the sidewall 502 is designated by a dotted line 8012, and overlaps with the embedded semiconductor layer formed in the region 212.

By providing the sidewalls so as to have the second end portions overlapping with the embedded semiconductor layers, a thick portion and a thin portion are formed to adjoin each other in each of the LDD regions (that is, the LDD regions are formed to be in both the embedded semiconductor layers and the thin film semiconductor layer). Accordingly, traveling speed of carriers is gradually decreased in the LDD regions, so that generation of hot carriers can be suppressed more effectively.

The interlayer insulating film 600 is formed over the insulator 100, the island-shaped semiconductor layer 200, the gate insulating film 300, the gate electrode 400, and the sidewalls 501 and 502.

In this embodiment mode, the interlayer insulating film 600 is formed so as to cover the island-shaped semiconductor layer 200, the gate insulating film 300, the gate electrode 400, and the sidewalls 501 and 502.

Contact holes are provided through the interlayer insulating film 600. The contact holes are formed overlapping with the embedded semiconductor layers (in the regions 211 and 212). In the contact holes, the wirings 701 and 702 are in contact with (are electrically connected to) the embedded semiconductor layers.

Forming the contact holes overlapping with the embedded semiconductor layers increases an etching margin. Consequently, the wirings and the semiconductor layers can have a contact reliably even if an etching apparatus has varied conditions.

The contact holes can be formed so as to reach insides of the embedded semiconductor layers, or to reach bottom portions of the embedded semiconductor layers. In both cases, the wirings and the semiconductor layers can have a contact reliably also at the sides of the contact holes formed in the embedded semiconductor layers because the embedded semiconductor layers have a large thickness.

Forming the contact holes so as to reach the insides of the embedded semiconductor layers allows a contact between the wirings and the semiconductor layers at bottoms and the sides of the contact holes, thereby providing a contact more reliably. Because the contact can be provided more reliably, an etching margin increases.

In this case, the embedded semiconductor layers are formed to be sufficiently thick so that the contact holes do not reach the bottom portions of the embedded semiconductor layers.

Figure 15:
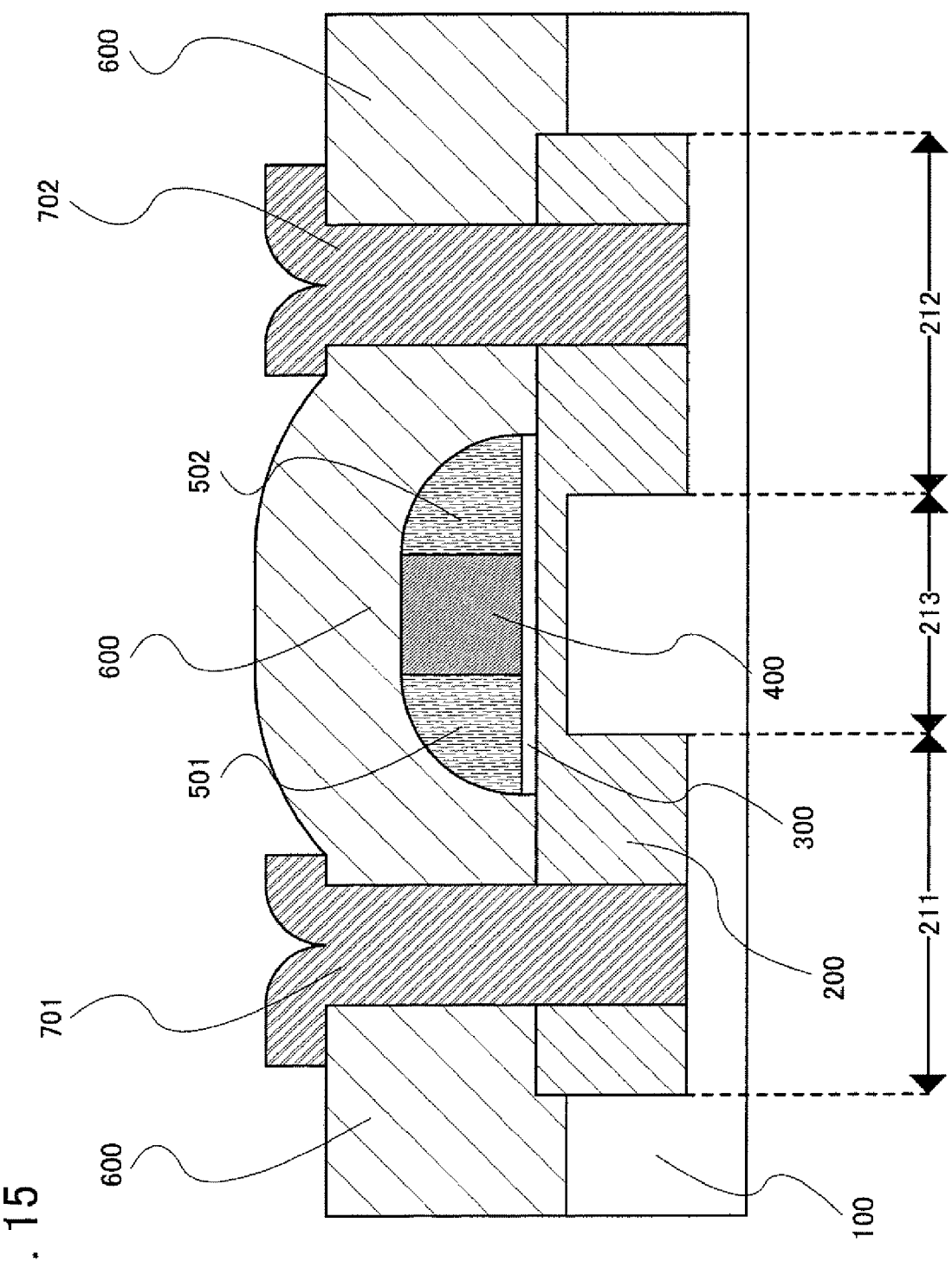
FIG. 15 is a cross-sectional view of a semiconductor device of the present invention.

However, the contact holes can also be formed so as to reach the bottom portions of the embedded semiconductor layers. In this case, the insulator 100 under the embedded semiconductor layers functions as an etching stopper, so that the etching is controlled excellently, which is favorable. Further, cross-sectional areas of the embedded semiconductor layers in contact with the wirings do not vary among the TFTs because a contact is provided at the sides of the contact holes and thus contact areas depend on the thickness of the embedded semiconductor layers. Consequently, variations in electric characteristics among the TFTs can be reduced (see FIG. 15).

The element structure as described above can increase an etching margin and achieve high performance in the semiconductor device.

Embodiment Mode 2

This embodiment mode describes an island-shaped semiconductor layer including embedded semiconductor layers and a thin film semiconductor layer in detail.

Forming the island-shaped semiconductor layer to have the embedded semiconductor layers and the thin film semiconductor layer can make the embedded semiconductor layers and the thin film semiconductor layer form a non-step shape (a continuous shape) at surfaces (upper surfaces) in boundary regions between the embedded semiconductor layers and the thin film semiconductor layer.

In order to form the non-step shape, the thickness of the embedded semiconductor layers is controlled by controlling the depth of openings formed in an insulator.

Accordingly, the boundaries have a non-step shape, and the thickness of the embedded semiconductor layers can be changed freely.

Further, the non-step shape in the boundaries can further increase an etching margin.

Here, problems in a step shape formed by embedded semiconductor layers and a thin film semiconductor layer at surfaces (upper surfaces) are explained in order to explain a technical significance of the non-step shape.

The non-step shape means a shape which does not have a step.

Figure 3:
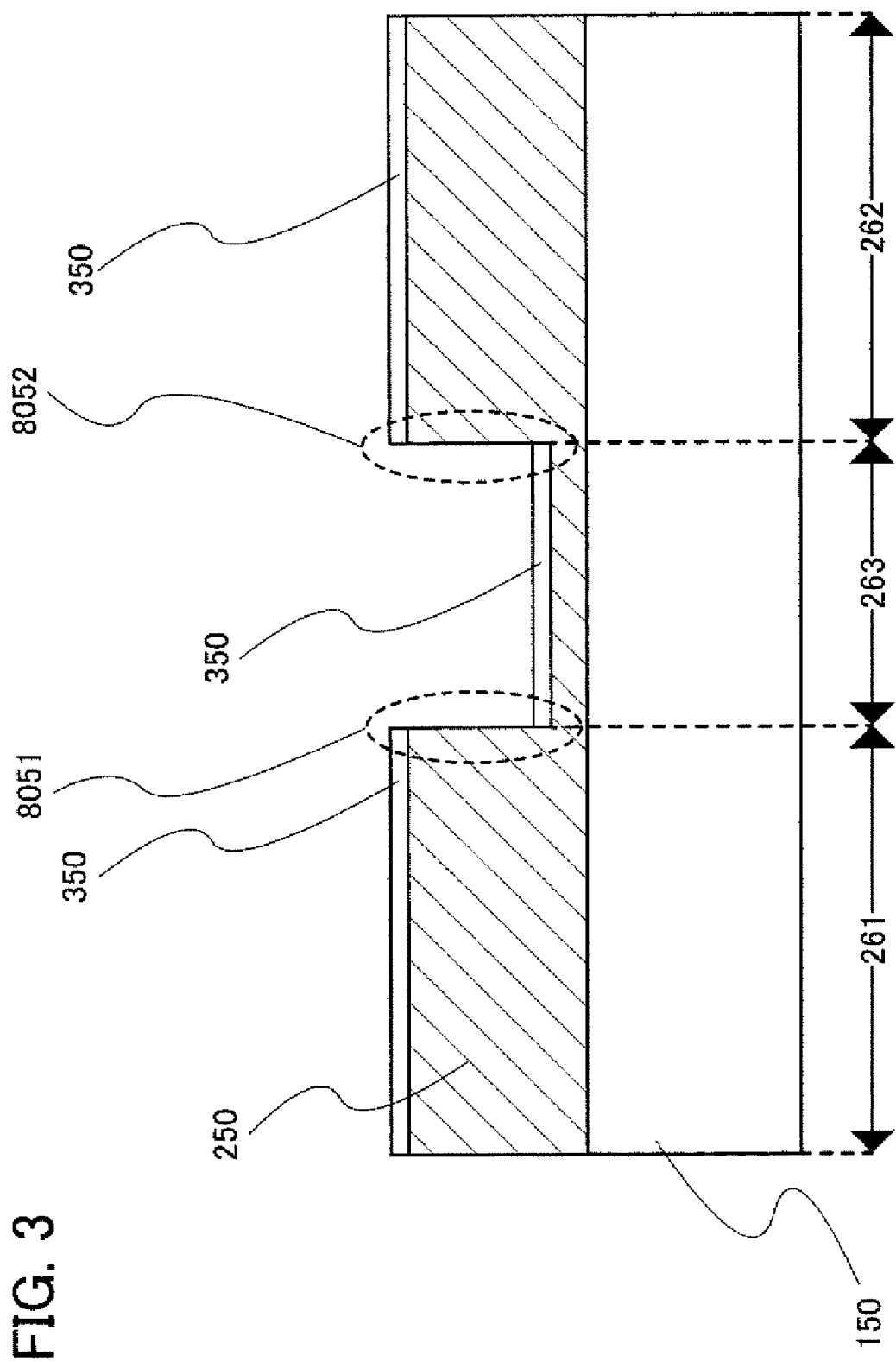
FIG. 3 is a cross-sectional view of an island-shaped semiconductor layer having a step shape.

As an example, FIG. 3 shows an island-shaped semiconductor layer 250 that does not have an embedded semiconductor layer. A semiconductor element shown in FIG. 3 includes the island-shaped semiconductor layer 250 formed over an insulator 150 and a gate insulating film 350 formed over the island-shaped semiconductor layer 250.

In FIG. 3, the island-shaped semiconductor layer 250 in a region 261 and a region 262 has a larger thickness than the island-shaped semiconductor layer 250 in a region 263.

In a structure of the semiconductor element shown in FIG. 3, a boundary region (designated by a dotted line 8051) between the regions 261 and 263 and a boundary region (designated by a dotted line 8052) between the regions 262 and 263 form a step shape, which has a step due to a difference in film thicknesses.

When the gate insulating film 350 is formed over the island-shaped semiconductor layer 250, which has such a step shape as the above, there occurs a problem that the gate insulating film 350 is disconnected at the step (refer to regions designated by the dotted lines 8051 and 8052).

Disconnection at a step means a phenomenon in which part of a film is broken due to insufficient step coverage with the film in forming the film over an object having a step shape.

Further, if the thickness of a channel formation region is reduced, a gate insulating film also needs to be thinned in accordance with this. If the gate insulating film is thinned, the probability of the disconnection of the gate insulating film due to the step shape increases remarkably. If the height of the step is larger than the thickness of the gate insulating film, disconnection occurs in a high probability.

Disconnection of the gate insulating film 350 leads to etching of the island-shaped semiconductor layer 250 in etching for forming a gate electrode, thereby causing disconnection of the semiconductor layer 250. That is to say, an etching margin for the gate etching is reduced.

Furthermore, the island-shaped semiconductor layer having such a step shape is formed as follows: a thick semiconductor film is formed and then is partially etched, thereby forming the thin semiconductor layer (like a portion in the region 263) and thick semiconductor layers (like portions in the regions 261 and 262).

Partial etching forms a highly uneven portion at an etched surface.

If the thin semiconductor layer (like the portion in the region 263) having a highly uneven portion serves as a channel formation region, the uneven portion physically obstructs travel of carriers. Consequently, field-effect mobility is lowered (the mobility is lowered due to the roughness).

Further, partial etching inevitably results in variations in etching amounts among semiconductor layers formed over a substrate.

Accordingly, channel formation regions vary in thickness, which results in variations in electric characteristics among TFTs.

As explained above, an island-shaped semiconductor layer having a step shape has various problems; therefore, the non-step shape is preferable.

Embodiment Mode 3

Figure 4:
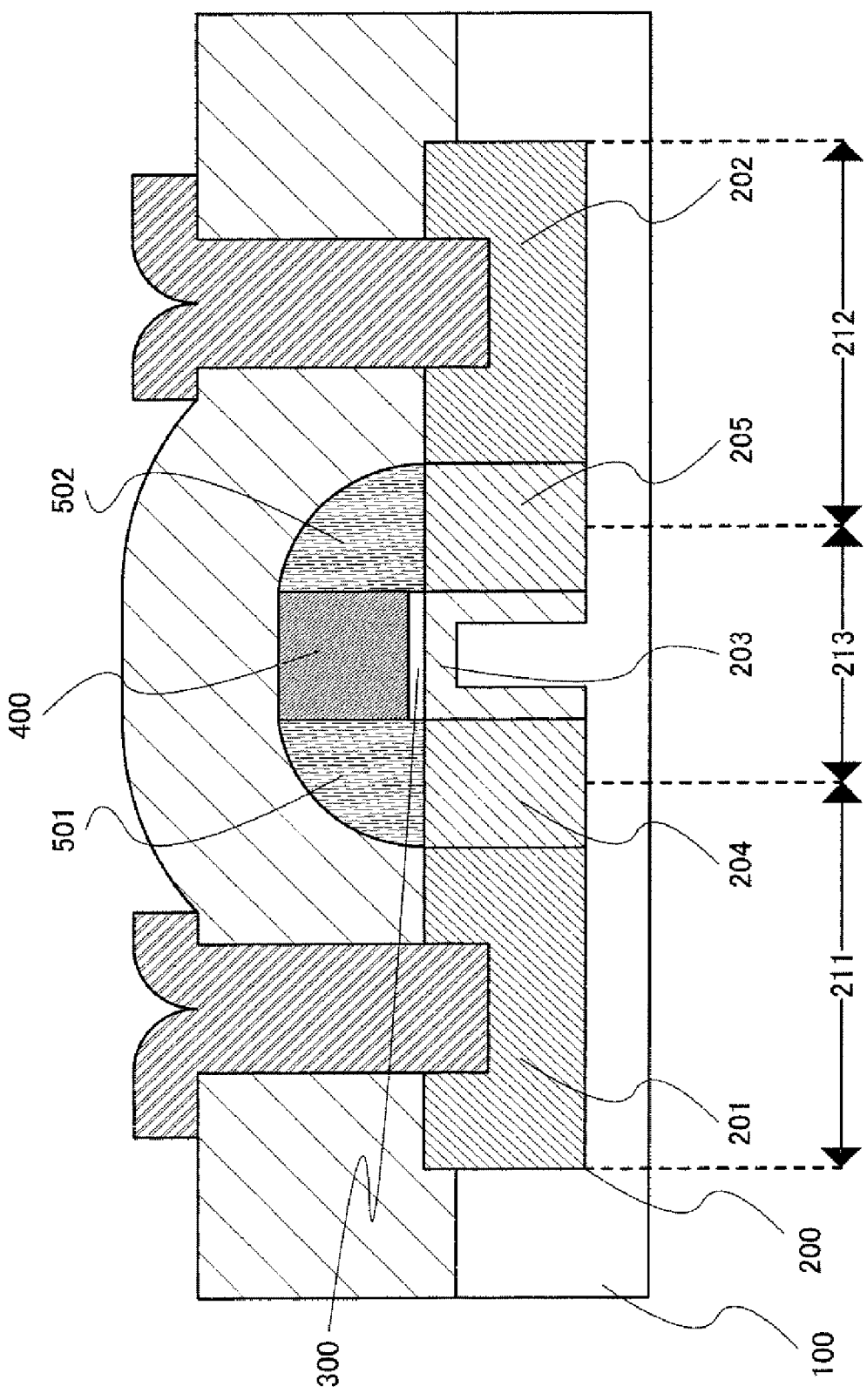
FIG. 4 is a cross-sectional view of a semiconductor device of the present invention.

FIG. 4 shows an example of a variation of Embodiment Mode 1 (FIGS. 1 and 2). A difference from Embodiment Mode 1 lies in a channel formation region including a thin film semiconductor layer and embedded semiconductor layers.

That is to say, first end portions of the embedded semiconductor layers are arranged so as to overlap with a gate electrode 400.

For such arrangement, openings in the insulator 100 may be formed so as to overlap with the gate electrode.

This can prevent the semiconductor layer at a position where the gate electrode 400 is not formed from disappearing, even if the gate insulating film of the position is etched away in etching for forming the gate electrode 400.

Therefore, this structure can increase a margin for the gate etching.

Further, dispersion of carriers is suppressed and field-effect mobility is enhanced because a portion having a small thickness and a portion having a large thickness are formed in the channel formation region.

Embodiment Mode 4

This embodiment mode describes a first method for forming an island-shaped semiconductor layer including embedded semiconductor layers and a thin film semiconductor layer.

Figure 5A:
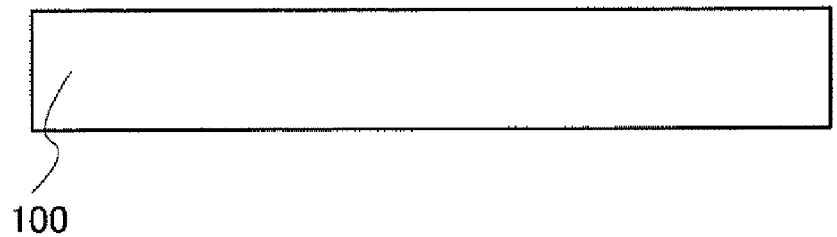
FIGS. 5A to 5D are cross-sectional views in accordance with the first method of the present invention.

An insulator 100 is provided. The insulator may be an insulating substrate or a base insulating film provided over a substrate (see FIG. 5A).

Figure 5B:
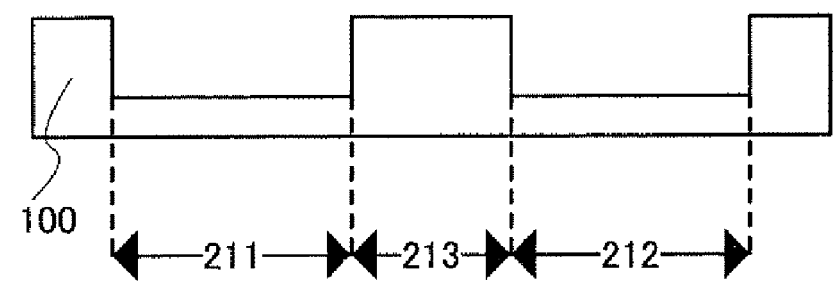

Next, openings are provided in the insulator 100 (see FIG. 5B).

The depth of the openings may be in a highly wide range of 1 nm to 10 μm. However, it is preferable that the depth of the openings be 20 to 300 nm because a semiconductor layer is embedded in the openings later.

When a base insulating film is formed and part of it functions as an etching stopper, the openings can be favorably formed without variations in thickness (an etching margin for forming the openings is increased).

As the insulating substrate, a glass substrate, a quartz substrate, a resin substrate, or the like can be used.

As the base insulating film, a single film or stacked films of a silicon oxide film, a silicon nitride film, a silicon nitride oxide film, which contains more nitrogen than oxygen, a silicon oxynitride film, which contains more oxygen than nitrogen, a resin film, and the like can be used.

Among them, it is preferable to stack a silicon oxide film over a silicon nitride film and form the openings, using the silicon nitride film as an etching stopper.

The reason is that a silicon nitride film has a low etching rate, and therefore, is suitable for an etching stopper.

Further, a silicon nitride film is excellent in a blocking property and prevents contamination from a substrate. However, a trap level is formed to affect an operation of a TFT inversely if a channel formation region and a silicon nitride film are formed to be in contact with each other; therefore, it is preferable to sandwich a silicon oxide film as a buffer.

Figure 5C:
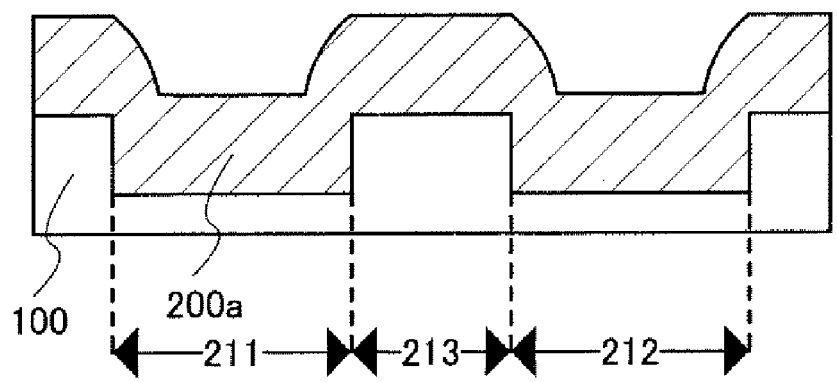

Next, a semiconductor film 200a with a larger thickness than the depth of the openings is formed (see FIG. 5C).

The semiconductor film 200a can be formed using silicon, silicon germanium, or the like by a CVD method, a sputtering method, or the like to have a larger thickness than the depth of the openings.

Figure 5D:
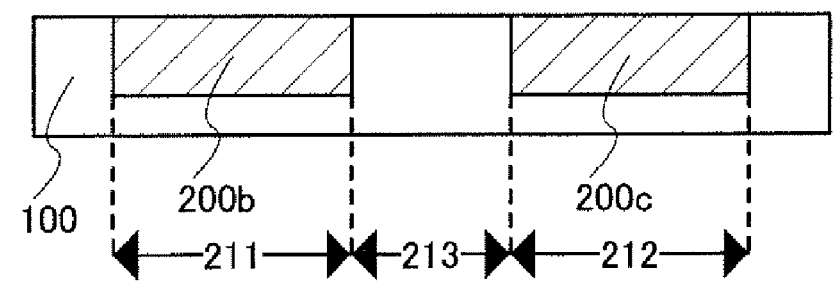

Next, semiconductor layers 200b and 200c that are embedded in the openings are formed by carrying out CMP (chemical mechanical polishing). At this time, a surface of the insulator 100 to be in contact with a portion to be a channel formation region is also planarized (see FIG. 5D).

Embedding in the openings by CMP is preferable for the following reason.

The insulator 100 has minute projections at the surface thereof. If the channel formation region has a large thickness, a problem seldom occurs because the projections have a height of about 30 nm or smaller.

If the channel formation region is thinned, however, step disconnections or pinholes arise at the channel formation region due to the projections. (The step disconnections or pinholes arise markedly when the channel formation region has a thickness of 60 nm or smaller, and at a high probability when the channel formation region has a thickness of 30 nm or smaller).

With regard to a thinned semiconductor layer, a crystalline semiconductor with excellent crystallinity can be obtained through crystallization of the thinned semiconductor layer by light irradiation (with laser, infrared rays, or the like). The crystallization may be carried out by thermal crystallization. The crystallization is not necessarily carried out when a polycrystalline semiconductor film is directly formed.

Here, in the laser crystallization, a semiconductor is heated by absorbing laser light, thereby being crystallized. In laser irradiation, the absorption rate of the laser light is enhanced by bringing a surface of the semiconductor into focus using an optical system.

Accordingly, the semiconductor layer needs to have a uniform height at the surface, which is to be irradiated with the laser light in order to obtain crystallinity with small variations.

Therefore, projections at the insulator cause portions with different heights at the surface of the semiconductor layer, and prevent uniform laser crystallization.

In particular, the thinner the semiconductor layer is, the smaller a region to absorb the laser light is and the lower the absorption rate of the laser light is (the smaller a margin for the laser light crystallization is); thus, the projections have a marked influence.

Accordingly, also from a perspective of the margin for the laser light crystallization, it is preferable to carry out CMP, thereby forming the semiconductor layers 200b and 200c and planarizing the insulator at the same time.

Embedding in the openings can be carried out by a method other than CMP. For example, etch back can be employed.

Here, in the CMP of the semiconductor film, slurry in which colloidal silica particles or fumed silica particles are dispersed in an inorganic alkali solution such as potassium hydroxide, or slurry in which colloidal silica particles or fumed silica particles are dispersed in an organic alkali solution such as ammonium or amine is used.

Figure 6A:
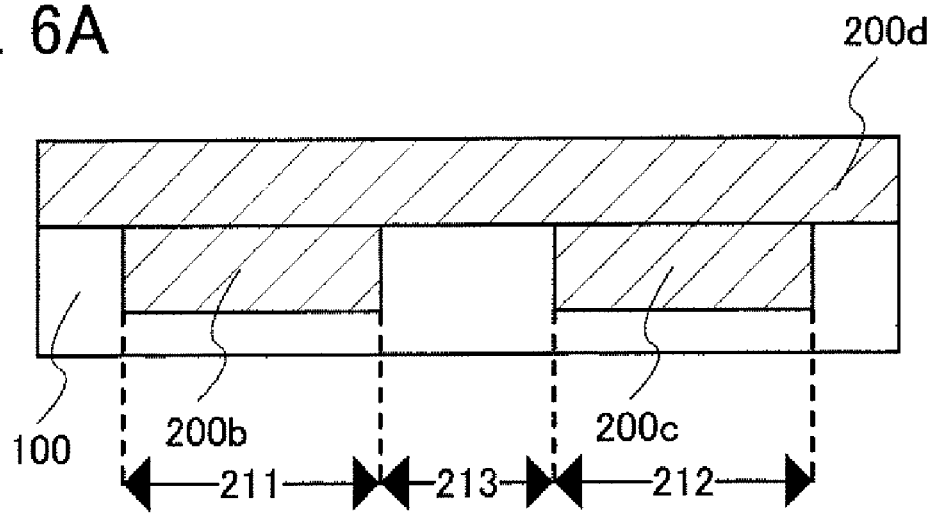
FIGS. 6A to 6C are cross-sectional views in accordance with the first method of the present invention.

Next, a semiconductor layer 200d is formed over the semiconductor layers 200b and 200c and the insulator 100 (see FIG. 6A).

Next, laser crystallization is carried out. It is preferable to carry out heat treatment for reducing hydrogen in the semiconductor layer 200d before the laser crystallization.

It is preferable to form the semiconductor layer 200d to be thick (preferably, 40 to 300 nm) because the thinner the semiconductor layers is, the lower the absorption rate of laser light is. When the semiconductor layer is formed to be thick, it is preferable to thin the semiconductor layer by CMP after laser crystallization.

Figure 6B:
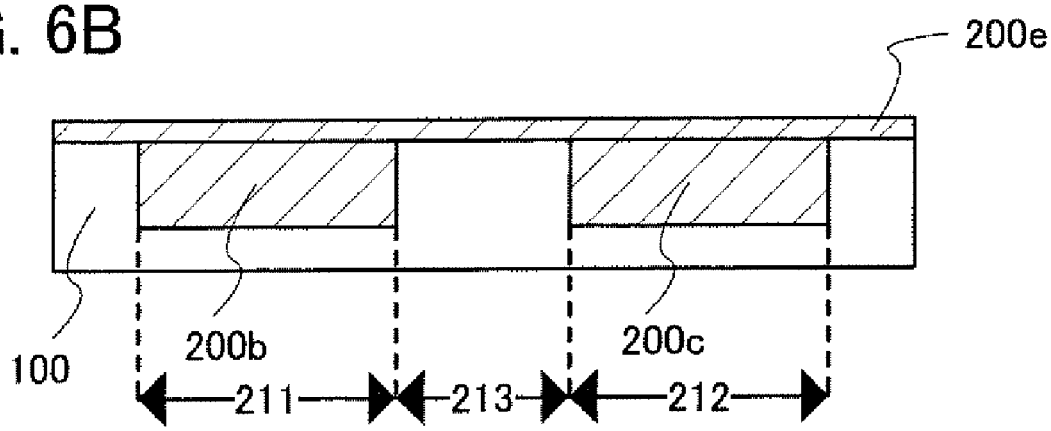

Projections (ridges) arise easily at the surface after laser crystallization because the laser crystallization is melt recrystallization; consequently, the ridges act as roughness to lower the field-effect mobility of the TFT. For the above reason, the semiconductor film is formed to be thick and then is thinned by CMP after the laser crystallization (see FIG. 6B).

CMP can planarize the channel formation regions in a plurality of island-shaped semiconductor layers formed over a substrate to have a uniform thickness, so that variations in electric characteristics among TFTs can be minimized.

With regard to the island-shaped semiconductor layer which has the step shape as shown in FIG. 3, CMP cannot be applied to thinning the channel formation region because partial etching is necessary.

CMP enables planarization of an entire surface (a top surface) of the island-shaped semiconductor layer as well as boundary regions between embedded semiconductor layers and a thin film semiconductor layer.

In CMP, increasing the particle diameter of the slurry can raise a polishing rate, and decreasing the particle diameter of the slurry can lower the polishing rate.

Further, the more OH ions are contained in the alkali solution, the higher the polishing rate can be; and the less OH ions are contained in the alkali solution, the lower the polishing rate can be.

It is preferable to carry out the CMP after the laser crystallization at a low polishing rate because it is required to have controllability of film thickness.

It is preferable to make the thin film semiconductor layer have a thickness of 30 nm or smaller, more preferably, 10 nm or smaller by the CMP after the laser crystallization.

Any laser can be used, and a semiconductor film with high crystallinity can be obtained when a continuous wave laser or a pulsed oscillation laser with a high repetition rate is used.

As explained above, the first method is as follows: a first semiconductor layer is formed over an insulator provided with openings; the first semiconductor layer is polished, whereby the first semiconductor layer is embedded in the openings and at the same time a surface of a portion in the insulator where the openings are not provided is polished; a second semiconductor layer is formed over the first semiconductor layer, which is embedded in the openings, and the insulator; and after crystallizing the second semiconductor layer (preferably, by a laser) the second semiconductor layer is polished.

When the first method is used, the embedded semiconductor layers have a stacked-layer structure (when laser crystallization is carried out, the stacked layers are melted and recrystallized).

Figure 6C:
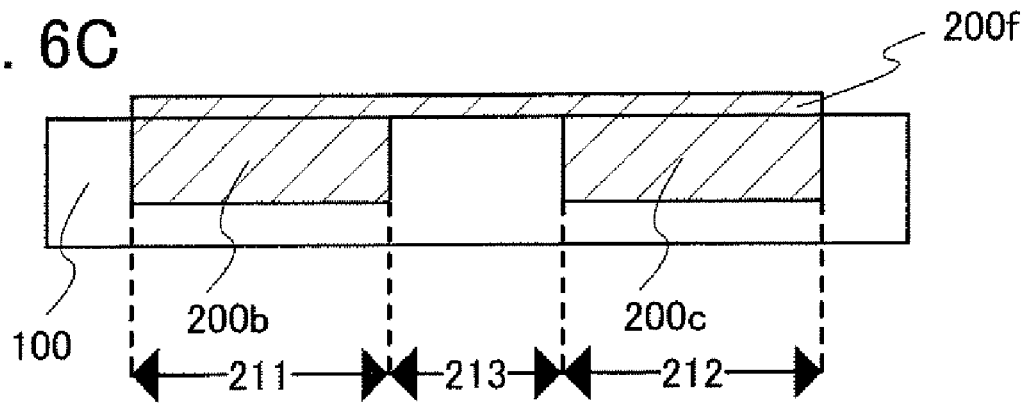

After that, an island-shaped semiconductor layer 200f is formed by separating each element (see FIG. 6C).

The elements may be isolated by any method. For example, the island-shaped semiconductor layer may be formed by etching. Further, the island-shaped semiconductor layer may be formed by oxidizing or nitriding part of the semiconductor layer.

Embodiment Mode 5

This embodiment mode describes a second method for forming an island-shaped semiconductor layer including embedded semiconductor layers and a thin film semiconductor layer.

Figure 7A:
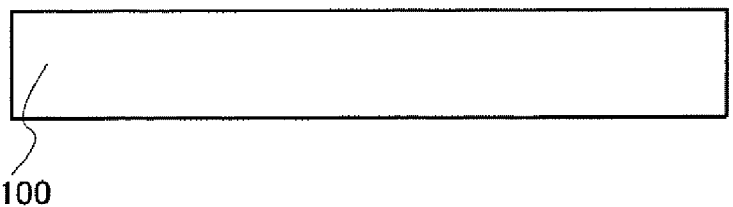
FIGS. 7A to 7E are cross-sectional views in accordance with the second method of the present invention.
Figure 7B:
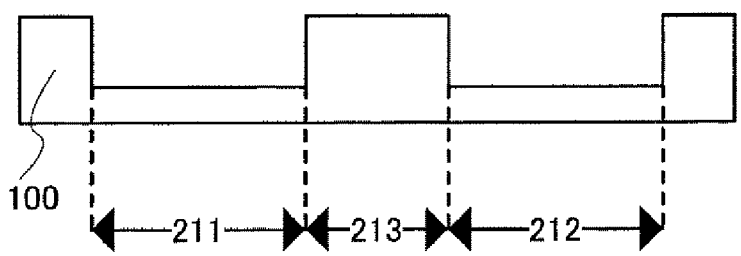
Figure 7C:
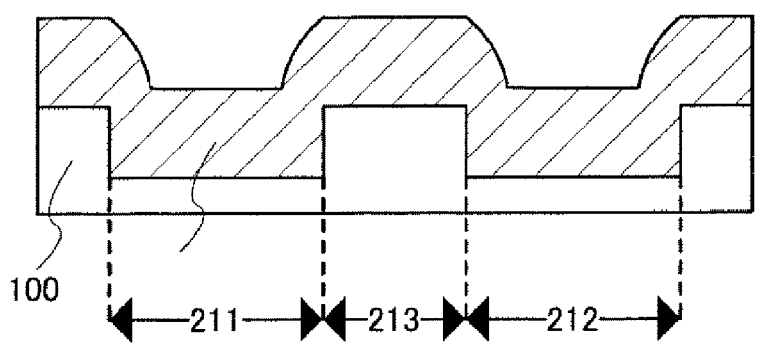

First, in the same manner as the first method, a semiconductor film 200a is formed over an insulator 100 provided with openings (see FIGS. 7A, 7B, and 7C).

Figure 7D:
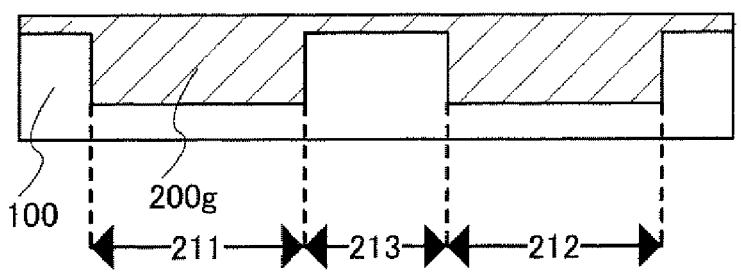

Then, after crystallizing the semiconductor film 200a, the semiconductor film 200a is polished by CMP, whereby a semiconductor layer 200g including embedded semiconductor layers and a thin film semiconductor layer is formed (see FIG. 7D).

Figure 7E:
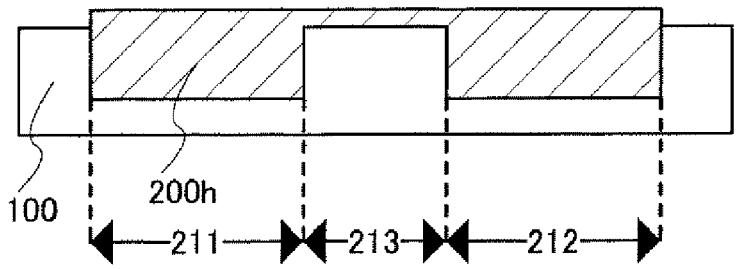

After that, an island-shaped semiconductor layer 200h is formed by separating elements (see FIG. 7E).

The elements may be isolated by any method. For example, the island-shaped semiconductor layer may be formed by etching. Further, the island-shaped semiconductor layer may be formed by oxidizing or nitriding part of the semiconductor layer.

The second method is superior to the first method in that it requires fewer steps.

When the second method is used, the embedded semiconductor layers have a single-layer structure.

Embodiment Mode 6

This embodiment mode describes a third method for forming an island-shaped semiconductor layer including embedded semiconductor layers and a thin film semiconductor layer.

In the first and second methods, it is difficult to obtain a single crystalline semiconductor layer; however, in the third method, a single crystalline semiconductor layer can be obtained.

Figure 8A:
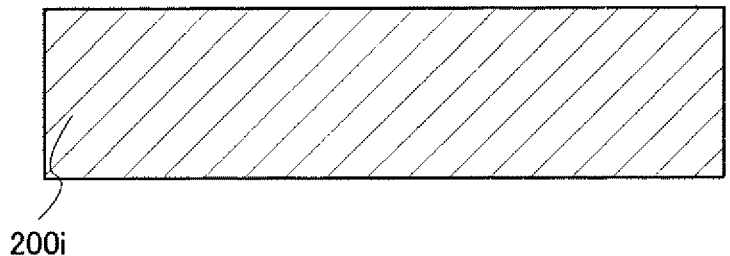
FIGS. 8A to 8D are cross-sectional views in accordance with the third method of the present invention.

First, a single crystalline semiconductor substrate 200i is provided (see FIG. 8A).

In this embodiment mode, a single crystalline silicon wafer is provided.

Then, openings are provided at a first surface of the single crystalline semiconductor substrate, and an insulator is formed at the first surface of the single crystalline semiconductor substrate provided with the openings. After that, the insulator is embedded in the openings, whereby an insulator 100a having an aperture shape is formed. Alternatively, an insulator having an aperture shape may be formed by partially oxidizing or nitriding the single crystalline semiconductor substrate after forming a mask over the first surface of the single crystalline semiconductor substrate (see FIG. 8B).

Figure 8B:
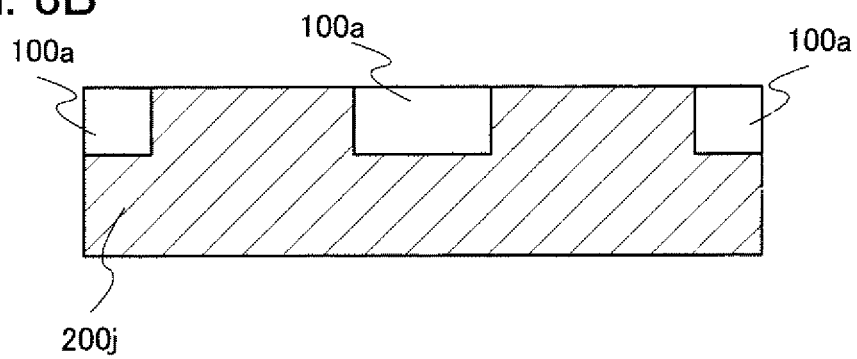

Through these steps, a semiconductor layer 200j that includes a semiconductor having a shape of being embedded in the insulator 100a having the aperture shape is formed (see FIG. 8B).

Figure 8C:
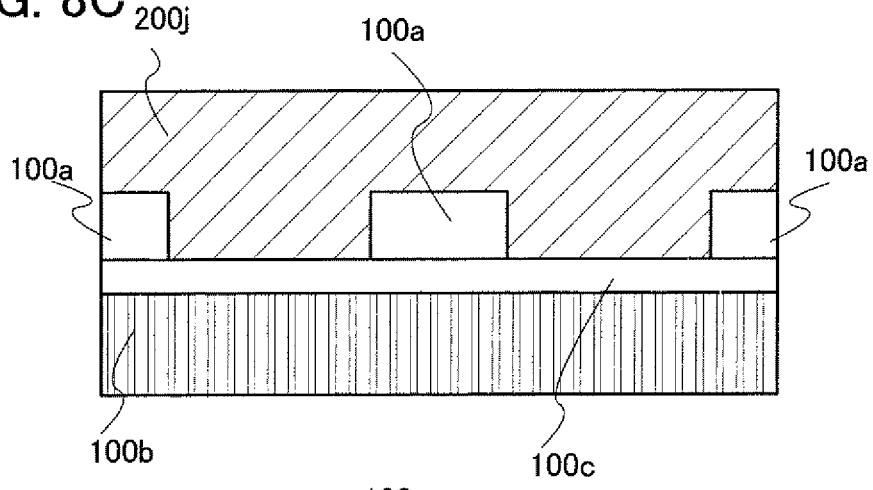

Next, a supporting substrate 100b that has an insulating surface 100c is provided. Then, after attaching the insulating surface 100c of the supporting substrate 100b and the first surface of the single crystalline semiconductor substrate 200j to each other, heat treatment is carried out, whereby the supporting substrate and the single crystalline semiconductor substrate in which the insulator is embedded are combined (see FIG. 8C).

In such a manner, "an insulator that has openings" and includes the insulator 100a and the insulating surface 100c is formed.

As the supporting substrate 100b, a silicon wafer, a glass substrate, a quartz substrate, a metal substrate, or the like can be used.

Although a glass substrate and a quartz substrate are insulating substrates and have insulating surfaces, the surface thereof can be coated with an insulating film.

A silicon wafer, a metal substrate, or the like is coated with an insulating film.

As the insulating film for coating, a silicon oxide film, a silicon nitride film, a resin film, or the like can be used.

If contamination, a trap level, and the like are taken into consideration, it is preferable to form the insulating surface by oxidizing a surface of a silicon wafer.

Figure 8D:
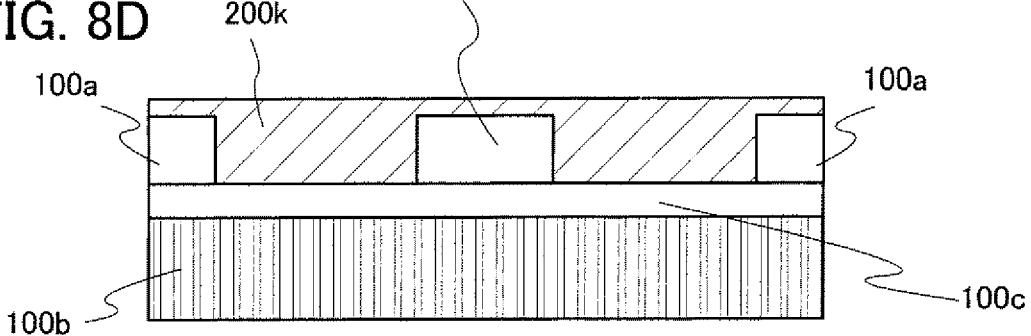

After that a second surface of the single crystalline semiconductor substrate is polished. It is preferable to carry out the polishing by CMP. Then, elements are isolated, so that an island-shaped semiconductor layer including embedded semiconductor layers and a thin film semiconductor layer can be formed (see FIG. 8D).

The elements may be isolated by any method. For example, the island-shaped semiconductor layer may be formed by etching. Further, the island-shaped semiconductor layer may be formed by oxidizing or nitriding part of the semiconductor layer.

The third method enables both the embedded semiconductor layers and the thin film semiconductor layer to be a single crystalline semiconductor. Further, the third method achieves high controllability of the thicknesses of the embedded semiconductor layers and the thin film semiconductor layer. Furthermore, the third method is preferable in that the surface (the top surface) of the island-shaped semiconductor layer is planarized by polishing.

In such a manner, the island-shaped semiconductor layer including the embedded semiconductor layers and the thin film semiconductor layer can be formed. The first to third methods are preferable for forming the island-shaped semiconductor layer including the embedded semiconductor layers and the thin film semiconductor layer.

However, the method for manufacturing a semiconductor device of the present invention is not limited to these. A main object of the present invention is to provide element structures of a semiconductor device; therefore, any method can be employed as long as an element structure that has an island-shaped semiconductor layer including embedded semiconductor layers and a thin film semiconductor layer can be formed.

Embodiment Mode 7

This embodiment mode describes a method for manufacturing a semiconductor device after formation of an island-shaped semiconductor layer including embedded semiconductor layers and a thin film semiconductor layer.

Figure 9A:
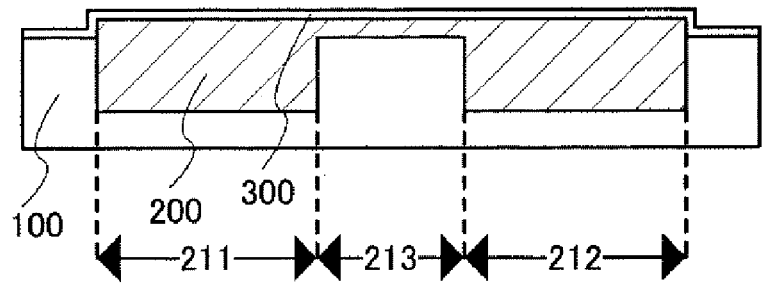
FIGS. 9A to 9D are cross-sectional views in accordance with a method for manufacturing a semiconductor device of the present invention.

First, a gate insulating film 300 is formed over an island-shaped semiconductor layer 200 (see FIG. 9A).

As a material for the gate insulating film 300, a silicon nitride film, a silicon oxide film, a silicon nitride oxide film, which contains more nitrogen than oxygen, a silicon oxynitride film, which contains more oxygen than nitrogen, or the like can be used.

The gate insulating film 300 can be formed by a CVD method, a sputtering method, or the like. The gate insulating film may have a stacked-layer structure. It is preferable that the gate insulating film have a small thickness of 200 nm or smaller. When a channel formation region is thinned, it is preferable that the gate insulating film have a thickness of 50 nm or smaller, more preferably, 20 nm or smaller.

Making the gate insulating film have a stacked-layer structure of different films can improve function thereof as an etching stopper, and increase an etching margin for forming a gate electrode and sidewalls.

Figure 9B:
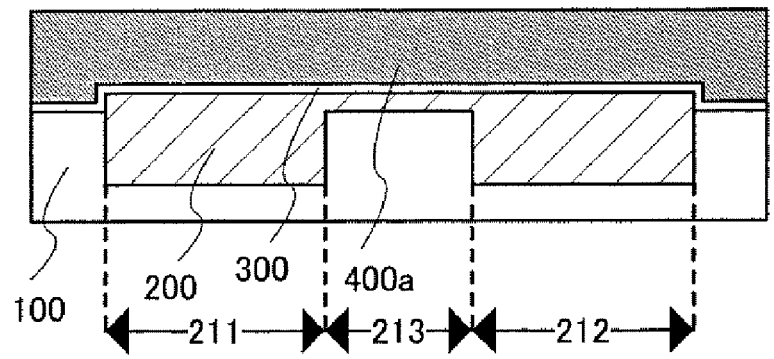

Next, a conductive film 400a is formed over the gate insulating film 300 (see FIG. 9B).

The conductive film 400a is formed using a conductive film of a single layer or stacked layers of W, Ta, Mo, Cr, Cu, Nd, Al, Al—Nd, Al—Si, Al—Ti, or the like by a sputtering method or the like. N-type or p-type silicon may also be used. It is preferable that the conductive film 400a have a thickness of 50 to 500 nm.

Figure 9C:
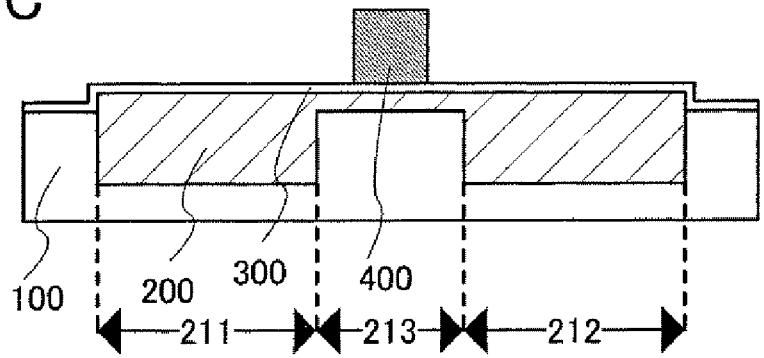

Next, a gate electrode 400 is formed over the thin film semiconductor layer (the semiconductor layer in a region 213) by etching the conductive film 400a (see FIG. 9C).

Figure 9D:
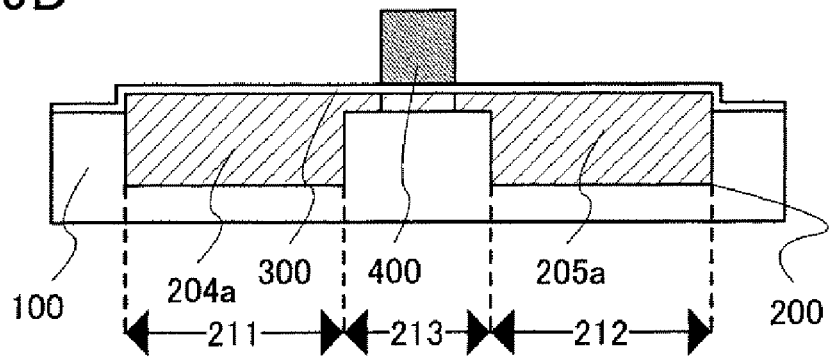

Next, low-concentration impurity regions 204a and 205a are formed in a self-aligned manner by adding an impurity element imparting conductivity using the gate electrode 400 as a mask (see FIG. 9D).

As the impurity element imparting n-type conductivity, phosphorus, arsenic, or the like can be used, and as the impurity element imparting p-type conductivity, boron can be used. The impurity element can be added by ion doping, ion implanting, laser doping, a thermal diffusion method, or the like.

Although this embodiment mode describes an example showing only one element for convenience, it is preferable to form a plurality of elements over a substrate and form a CMOS circuit in which both an n-channel TFT and a p-channel TFT are formed.

When a CMOS is formed, an n-type impurity element and a p-type impurity element may be added using resist masks in different steps.

Figure 10A:
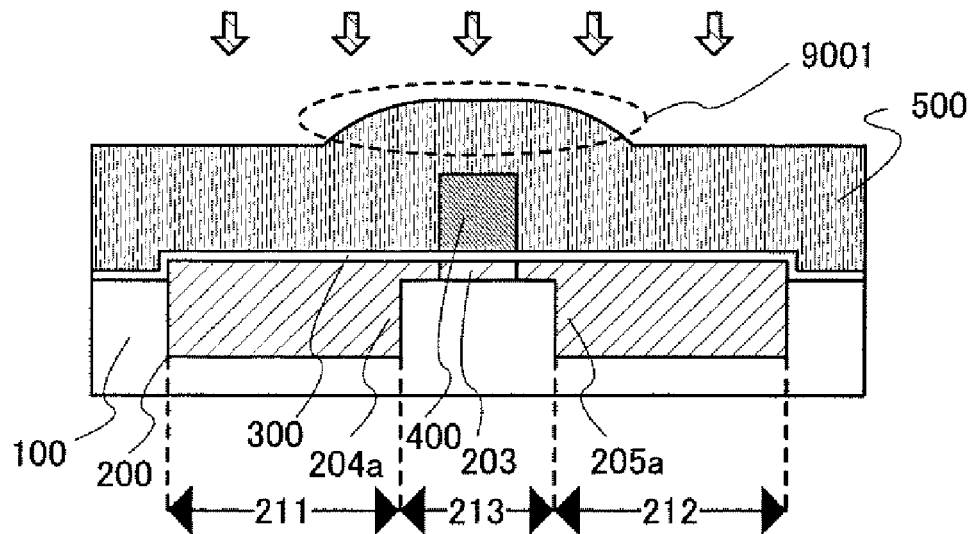
FIGS. 10A to 10C are cross-sectional views in accordance with a method for manufacturing a semiconductor device of the present invention.

Next, a film 500 for forming sidewalls is formed and etched back (see FIG. 10A).

As the film for forming the sidewalls, if it is an insulating film, a silicon nitride film, a silicon oxide film, a silicon nitride oxide film, which contains more nitrogen than oxygen, a silicon oxynitride film, which contains more oxygen than nitrogen, or the like can be used. It is preferable that the film for forming the sidewalls have a thickness of 100 nm to 1 μm. As the film for forming the sidewalls, a semiconductor film (e.g., silicon or silicon germanium), or a conductive film (e.g., aluminum) may be used.

When the film 500 for forming the sidewalls is formed, a bump designated by a dotted line 9001 is formed as an influence of a bump of the gate electrode 400 (see FIG. 10A).

Figure 10B:
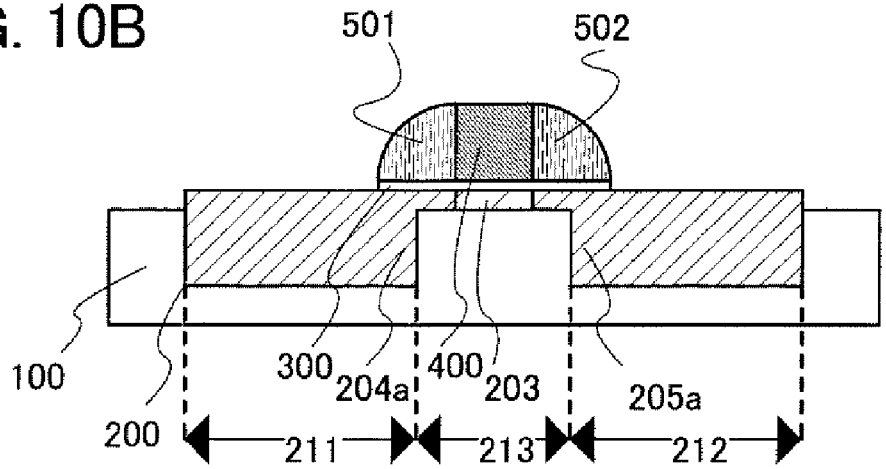

The film 500 for forming the sidewalls is etched back, so that sidewalls 501 and 502 are formed, reflecting the bump shape (see FIG. 10B).

At this time, an etching margin for forming the sidewalls is increased by making second end portions of the sidewalls 501 and 502 overlap partly with the embedded semiconductor layers.

If the gate insulating film and the film for forming the sidewalls are formed of materials which mainly contain the same element, the gate insulating film is etched in etching back to expose the semiconductor layer. Therefore, in such a case, it is particularly preferable to make the second end portions of the sidewalls overlap partly with the embedded semiconductor layers.

The length of the sidewalls is determined by the thicknesses of the gate electrode 400 and the film 500 for forming the sidewalls, and etching time.

Figure 10C:
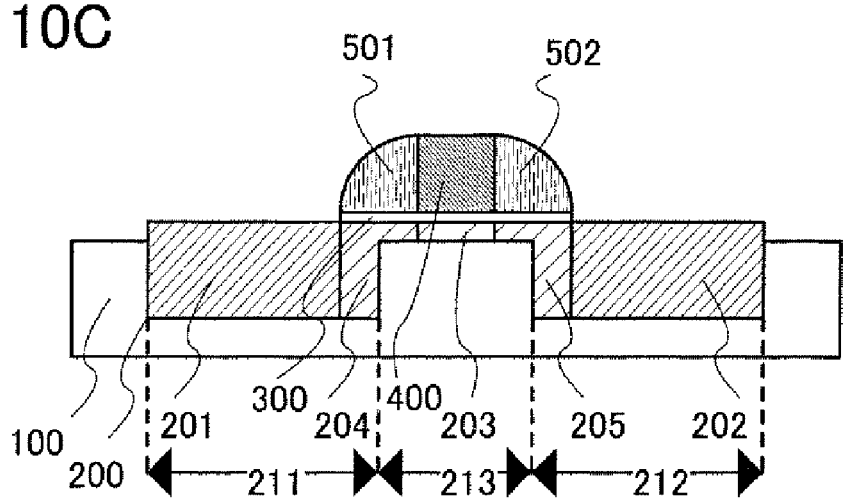

Next, using the gate electrode 400 and the sidewalls 501 and 502 as masks, an impurity element imparting conductivity is added, whereby a source region 201 and a drain region 202 are formed in a self-aligned manner (see FIG. 10C).

At this time, the element imparting the same conductivity type as the low-concentration impurity regions is used.

Figure 11A:
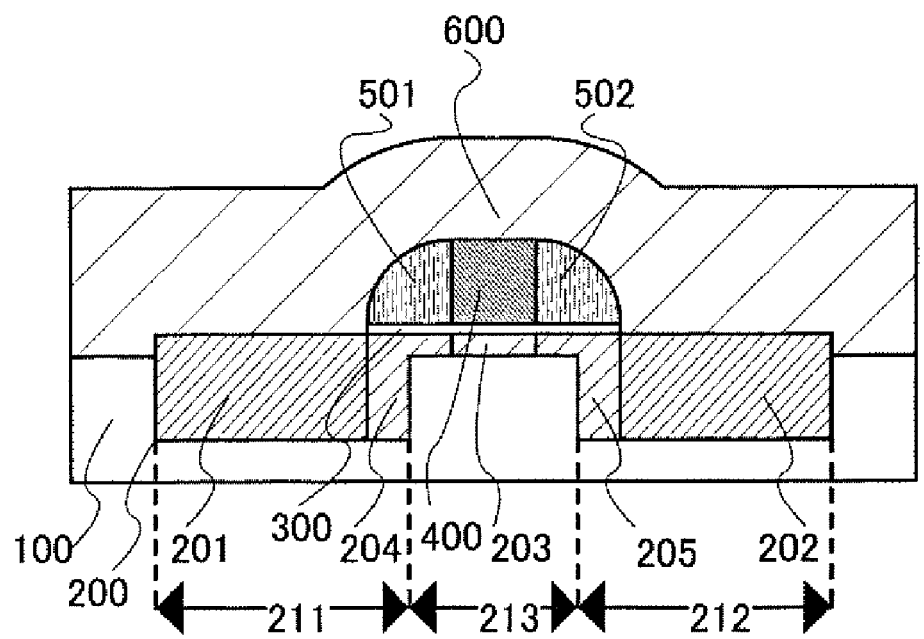
FIGS. 11A and 11B are cross-sectional views in accordance with a method for manufacturing a semiconductor device of the present invention.

Next, an interlayer insulating film 600 is formed over an insulator 100, the island-shaped semiconductor layer 200, the gate insulating film 300, the gate electrode 400, and the sidewalls 501 and 502 (see FIG. 11A).

The interlayer insulating film 600 can be formed using a silicon nitride film, a silicon oxide film, a silicon nitride oxide film, which contains more nitrogen than oxygen, a silicon oxynitride film, which contains more oxygen than nitrogen, or the like. An organic resin film such as acrylic, polyimide, or siloxane polymer can also be used. The interlayer insulating film may have a single-layer or stacked-layer structure. It is preferable that the interlayer insulating film have a larger thickness than that of the gate electrode 400.

In addition, heat treatment may be carried out for activating the impurity element before and after forming the interlayer insulating film 600.

Figure 11B:
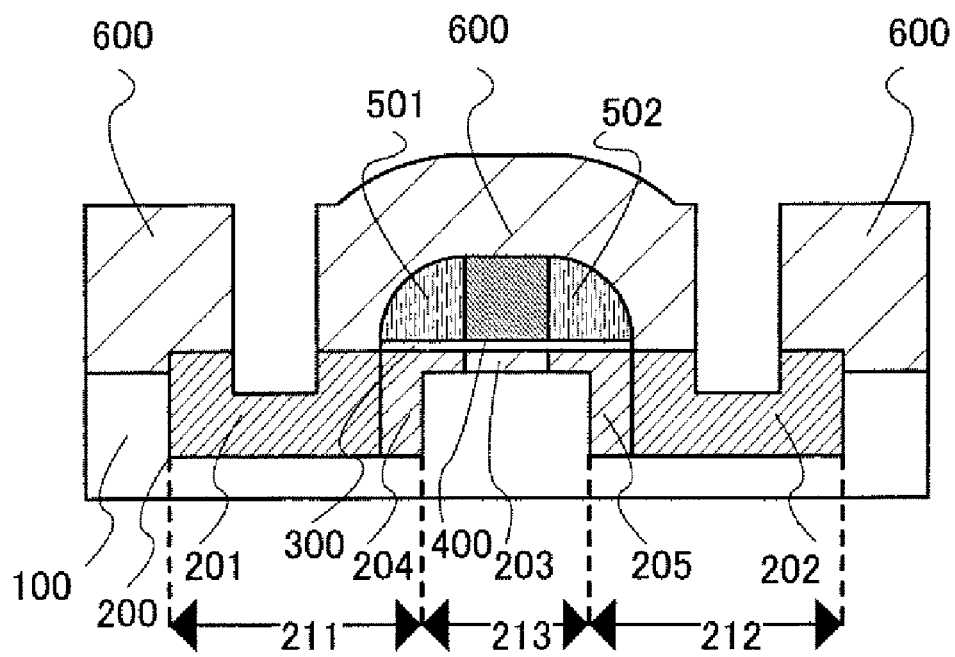

Next, contact holes are formed through the interlayer insulating film so as to overlap with the embedded semiconductor layers (in regions 211 and 212) (see FIG. 11B).

An etching margin for forming the contact holes can be increased because the embedded semiconductor layers are thick.

Forming the contact holes so as to reach insides of the embedded semiconductor layers allows a contact between wirings and the semiconductor layers at bottoms and sides of the contact holes, thereby providing a contact more reliably. Because the contact can be provided more reliably, an etching margin increases, as a matter of course.

The contact holes may be formed through the embedded semiconductor layers.

In this case, excellent etching controllability can be obtained because the insulator 100 under the embedded semiconductor layers functions as an etching stopper.

Further, cross-sectional areas of the embedded semiconductor layers in contact with the wirings do not vary because a contact is provided at the sides of the contact holes and thus contact areas depend on the thickness of the embedded semiconductor layers. Consequently, variations in electric characteristics among the TFTs can be reduced Because the embedded semiconductor layers are thick, a contact can be obtained reliably even if the channel formation region is thinned. An etching margin is increased because the contact can be obtained reliably.

Figure 12A:
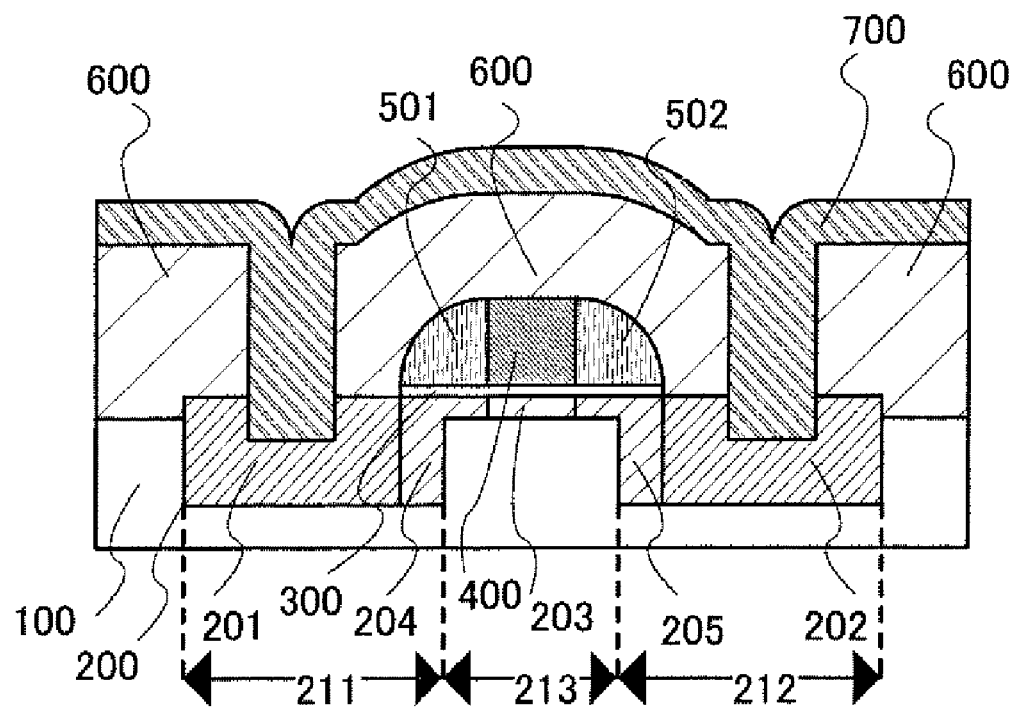
FIGS. 12A and 12B are cross-sectional views in accordance with a method for manufacturing a semiconductor device of the present invention.

Next, a conductive film 700 is formed over the interlayer insulating film 600 and in the contact holes (see FIG. 12A).

The conductive film 700 is formed using a conductive film of a single layer or stacked layers of Mo, Cr, Cu, Nd, Al, Al—Nd, Al—Si, Al—Ti, or the like. It is preferable that the conductive film 700 have a thickness of 100 nm to 3 μm.

Figure 12B:
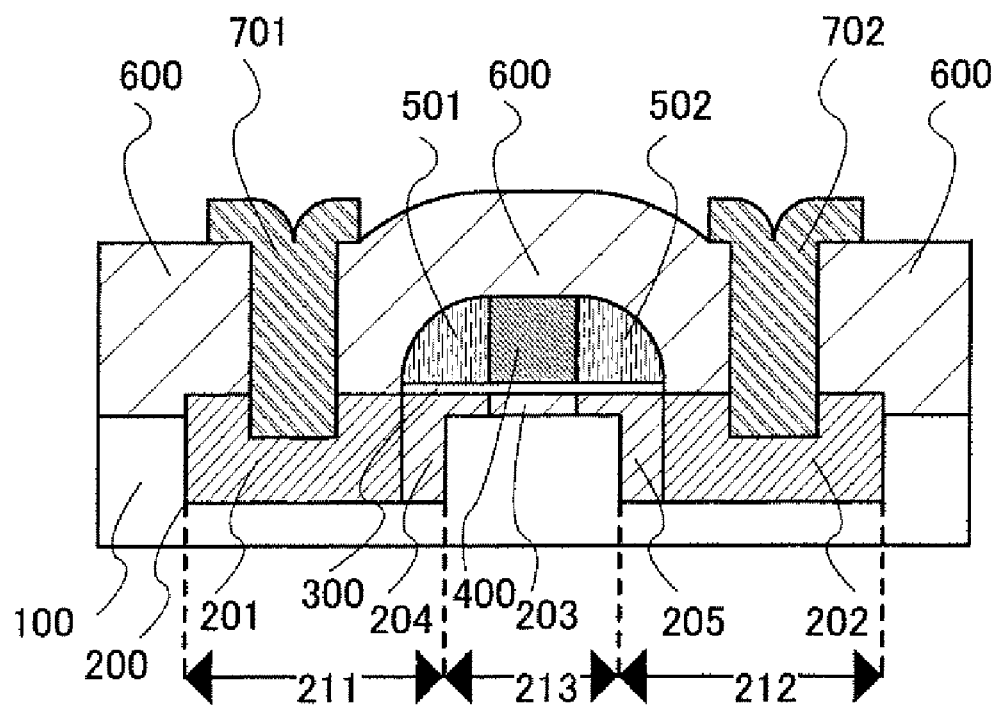

Then, the conductive film 700 is etched, thereby forming wirings 701 and 702 (see FIG. 12B).

After that, a multi-layer wiring, in which a plurality of interlayer insulating films and wirings are stacked, may be formed appropriately in accordance with the design of the circuit.

Embodiment Mode 8

This embodiment mode describes examples of a semiconductor device of the present invention.

The present invention can be applied to a pixel portion, a drive circuit portion, or the like of a display device provided with an organic light-emitting element, an inorganic light-emitting element, a liquid crystal element or the like.

Further, the present invention can be applied to an electronic device provided with a memory medium, such as a digital camera, a car navigator, a laptop, a game machine, a personal digital assistant (e.g., a portable telephone or a portable game machine), or a home game machine.

Furthermore, the present invention can be applied to an integrated circuit such as a CPU (a central processing unit).

Figure 13A:
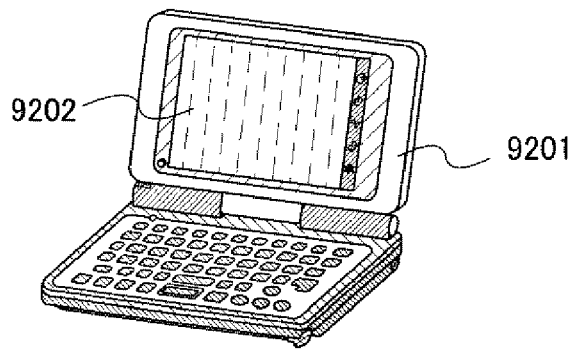
FIGS. 13A to 13E are examples of electronic devices to which the present invention can be applied.
Figure 13B:
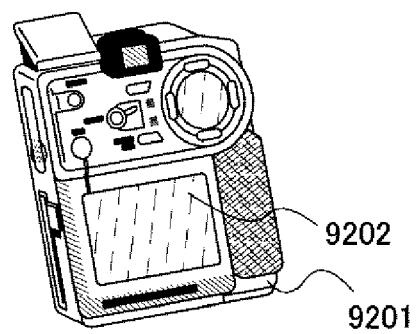
Figure 13C:
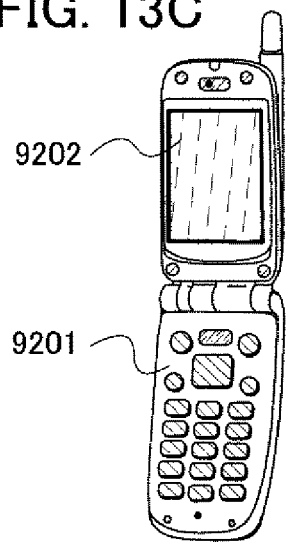
Figure 13D:
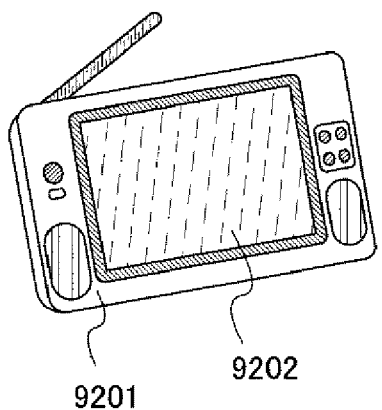
Figure 13E:
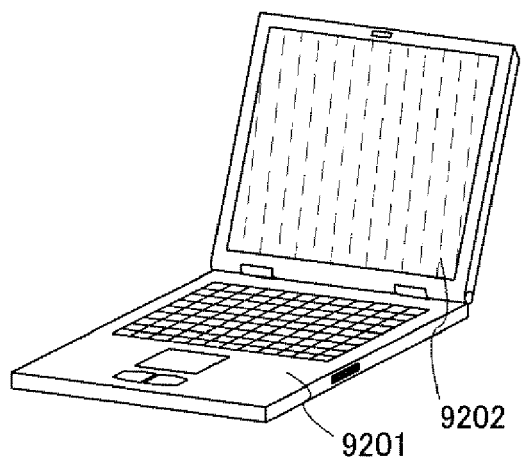
Figure 14A:
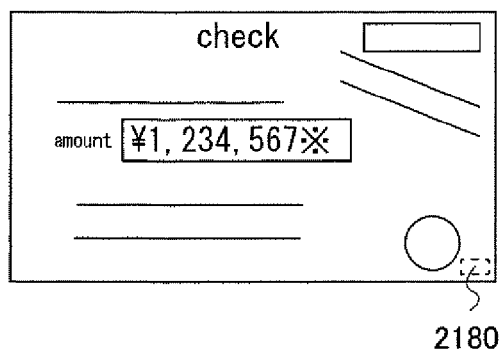
FIGS. 14A to 14H are examples of non-contact tags to which the present invention can be applied.
Figure 14B:
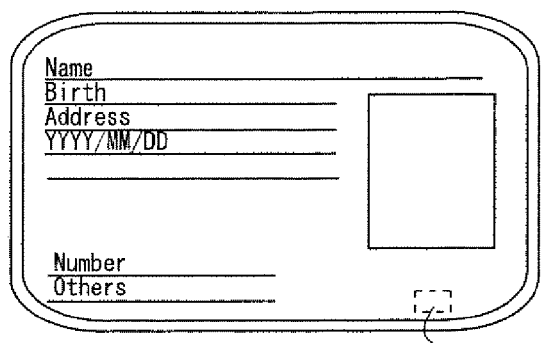
Figure 14C:
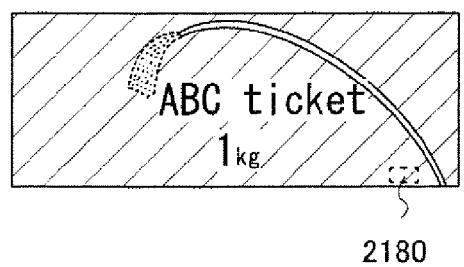
Figure 14D:
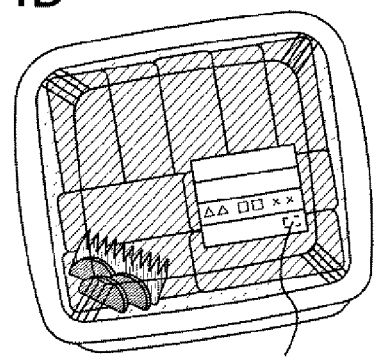
Figure 14E:
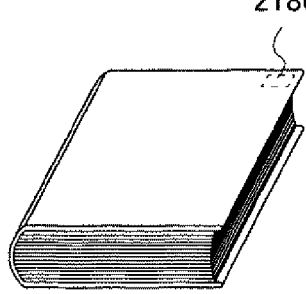
Figure 14F:
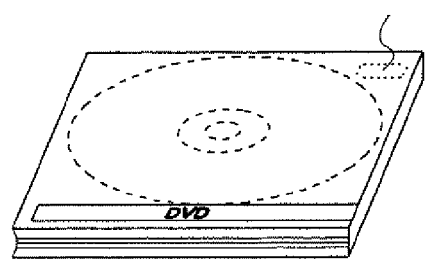
Figure 14G:
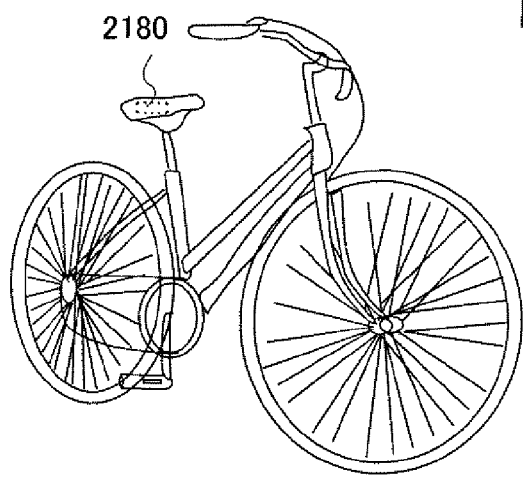
Figure 14H:
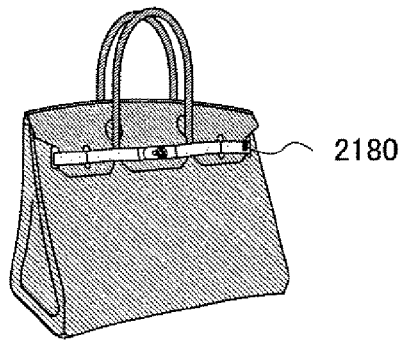

For example, FIG. 13A shows a personal digital assistant. FIG. 13B shows a digital camera. FIG. 13C shows a portable telephone. FIG. 13D shows a car navigator. FIG. 13E shows a laptop. The present invention can be applied to an integrated circuit incorporated in a main body 9201 or a display portion 9202 of these devices.

In manufacturing a display device, it is preferable to employ the first or second method and use a glass substrate, which is inexpensive and does not have a limit of the size of the substrate.

Furthermore, the present invention can be applied to a semiconductor device which enables non-contact input and output of data. The semiconductor device which enables non-contact input and output of data is called an RFID tag, an ID tag, an IC tag, an IC chip, an RF tag, a wireless tag, an electronic tag, or a wireless chip depending on the usage pattern. These are generically called non-contact tags (non-contact chips).

For example, the present invention can be applied to a non-contact tag 2180 of FIGS. 14A to 14H.

It is preferable to apply the third method, which enables the semiconductor layer to be single crystalline, to an integrated circuit, a non-contact tag, and the like because these are required to have high performance.

This application is based on Japanese Patent Application serial no. 2007-058203 filed with Japan Patent office on Mar. 8, 2007, the entire contents of which are hereby incorporated by reference.

What is claimed is:

1. A method of manufacturing a semiconductor device, comprising the steps of:
   forming at least two openings on an insulator, each of the at least two openings being in first regions;
   forming first semiconductor layers embedded in the at least two openings;
   forming an island-shaped second semiconductor layer on the first semiconductor layers, and on the insulator at a second region which is between the first regions;
   forming a gate insulating film over the island-shaped second semiconductor layer;
   forming a gate electrode over the gate insulating film;
   forming a first impurity region in the island-shaped second semiconductor layer, using the gate electrode as a mask;
   forming an interlayer insulating film over the gate electrode; and
   etching the interlayer insulating film selectively to form contact holes reaching the island-shaped second semiconductor layer in the first regions.

2. The method of manufacturing a semiconductor device according to claim 1, after forming the first impurity region, and before forming the interlayer insulating film, further comprising the steps of:
   forming a sidewall layer in contact with a side of the gate electrode;
   forming a second impurity region in the island-shaped second semiconductor layer, using the gate electrode and the sidewall layer as a mask.

3. The method of manufacturing a semiconductor device according to claim 2, wherein the sidewall layer has a first end portion which is in contact with the gate electrode and a second end portion which is an opposite side of the first end portion, and
   wherein the second end portion is formed in one of the first regions.

4. The method of manufacturing a semiconductor device according to claim 1, wherein an end portion of the gate electrode is formed in the second region.

5. A method of manufacturing a non-contact tag, comprising the steps of:
- forming at least two openings on an insulator, each of the at least two openings being in first regions;
- forming first semiconductor layers embedded in the at least two openings;
- forming an island-shaped second semiconductor layer on the first semiconductor layers, and on the insulator at a second region which is between the first regions;
- forming a gate insulating film over the island-shaped second semiconductor layer;
- forming a gate electrode over the gate insulating film;
- forming a first impurity region in the island-shaped second semiconductor layer, using the gate electrode as a mask;
- forming an interlayer insulating film over the gate electrode; and
- etching the interlayer insulating film selectively to form contact holes reaching the island-shaped second semiconductor layer in the first regions.

6. The method of manufacturing a non-contact tag according to claim 5, after forming the first impurity region, and before forming the interlayer insulating film, further comprising the steps of:
- forming a sidewall layer in contact with a side of the gate electrode;
- forming a second impurity region in the island-shaped second semiconductor layer, using the gate electrode and the sidewall layer as a mask.

7. The method of manufacturing a non-contact tag according to claim 6, wherein the sidewall layer has a first end portion which is in contact with the gate electrode and a second end portion which is an opposite side of the first end portion, and
- wherein the second end portion is formed in one of the first regions.

8. The method of manufacturing a non-contact tag according to claim 5, wherein an end portion of the gate electrode is formed in the second region.

9. A method of manufacturing an electronic device, comprising the steps of:
- forming at least two openings on an insulator, each of the at least two openings being in first regions;
- forming first semiconductor layers embedded in the at least two openings;
- forming an island-shaped second semiconductor layer on the first semiconductor layers, and on the insulator at a second region which is between the first regions;
- forming a gate insulating film over the island-shaped second semiconductor layer;
- forming a gate electrode over the gate insulating film;
- forming a first impurity region in the island-shaped second semiconductor layer, using the gate electrode as a mask;
- forming an interlayer insulating film over the gate electrode; and
- etching the interlayer insulating film selectively to form contact holes reaching the island-shaped second semiconductor layer in the first regions.

10. The method of manufacturing an electronic device according to claim 9, after forming the first impurity region, and before forming the interlayer insulating film, further comprising the steps of:
- forming a sidewall layer in contact with a side of the gate electrode;
- forming a second impurity region in the island-shaped second semiconductor layer, using the gate electrode and the sidewall layer as a mask.

11. The method of manufacturing an electronic device according to claim 10, wherein the sidewall layer has a first end portion which is in contact with the gate electrode and a second end portion which is an opposite side of the first end portion, and
- wherein the second end portion is formed in one of the first regions.

12. The method of manufacturing an electronic device according to claim 10, wherein an end portion of the gate electrode is formed in the second region.

* * * * *